(12) United States Patent
Ando et al.

(10) Patent No.: US 6,461,059 B2
(45) Date of Patent: Oct. 8, 2002

(54) PHOTO-ELECTRONIC DEVICE AND METHOD OF PRODUCING THE SAME

(75) Inventors: Kazunori Ando, Komoro; Shoichi Takahashi, Saku; Hiroshi Naka, Komoro, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/800,502

(22) Filed: Mar. 8, 2001

(65) Prior Publication Data
US 2001/0026665 A1 Oct. 4, 2001

(30) Foreign Application Priority Data
Mar. 31, 2000 (JP) .................................................. 098012

(51) Int. Cl.⁷ .............................. G02B 6/255; G02B 6/00
(52) U.S. Cl. .......................................... 385/94; 385/147
(58) Field of Search ............................ 385/80–96, 147; 250/484.5; 438/488; 359/326; 358/497

(56) References Cited

U.S. PATENT DOCUMENTS

| 4,642,412 A | * | 2/1987 | Muramatsu et al. ........ 136/244 |
| 4,797,106 A | * | 1/1989 | Umehara et al. ............ 358/497 |
| 5,353,149 A | * | 10/1994 | Urakami et al. ............. 359/326 |
| 6,211,043 B1 | * | 4/2001 | Nishio et al. ............... 438/488 |
| 6,271,528 B1 | * | 8/2001 | Struye et al. ............. 250/484.5 |

FOREIGN PATENT DOCUMENTS

| JP | 10-282369 | 10/1998 |
| JP | 10-307235 | 11/1998 |

* cited by examiner

Primary Examiner—Akm E. Ullah
(74) Attorney, Agent, or Firm—Mattingly, Stanger & Malur, P.C.

(57) ABSTRACT

A photo-electronic device including a package having a main body portion containing parts including a photoelectric conversion element at inside thereof and a guide portion a front end of which faces the photoelectric conversion element for guiding, in a penetrated state, an optical fiber for transmitting and receiving light to and from the photoelectric conversion element, in which the optical fiber is fixed to the guide portion by adhering agent at the guide portion and portions of the main body portion including the photoelectric conversion element and a front end portion of the optical fiber are covered by a protective film formed by a resin transparent to the light and a dam is provided between the protective film and the adhering agent such that the protective film and the adhering agent are not brought into contact with each other.

16 Claims, 17 Drawing Sheets

PHOTO-ELECTRONIC DEVICE AND METHOD OF PRODUCING THE SAME

BACKGROUND OF THE INVENTION

The present invention relates to a photo-electronic device (semiconductor optical module) and a method of producing thereof, particularly to a technology effectively applied to a technology of producing a photo-electronic device capable of preventing breakage of an optical fiber core line comprising a core and a clad and extended in a package and capable of preventing a deterioration in transmission efficiency of light.

There is used a photo-electronic device integrated with a semiconductor laser (semiconductor laser element: semiconductor laser chip) as a light source for an information processing apparatus or a light source for optical communication. As an example of a photo-electronic device, there is disclosed, in Japanese Patent Laid-Open No. 282369/1998 or Japanese Patent Laid-Open No. 307235/1998, an optical communication apparatus (semiconductor laser module) forming a package by a case and a lid (cap) comprising plastics (resin) formed by a transfer mold process, containing a semiconductor laser (laser diode) or a photo detector (photo diode) and extending an optical fiber to inside and outside of the package.

Further, portions of a pad (pad portion) and a lead frame for fixing a silicon substrate, are embedded in the case simultaneously with the transfer mold operation. The silicon substrate is fixed with the semiconductor laser. The optical fiber extended to inside and outside of the package is constructed by a structure in which the optical fiber core line is covered with a cover member up to a middle of the package and a front end thereof is a bare optical fiber at which the optical fiber core line is exposed by removing the cover member. The optical fiber core line is constituted by the core and the clad covering the core and both of them comprise, for example, quartz and are brittle and easy to break by external force.

Further, in the package, the semiconductor laser is covered with transparent gel-like resin comprising silicone resin.

SUMMARY OF THE INVENTION

The applicants have investigated to use a copper frame having excellent thermal conductivity (thermal expansion coefficient $\alpha=17\times10^{-6}/°$ C.) as a lead frame for radiating heat generated at a semiconductor laser element to outside of the package in developing a photo-electronic device integrated with the semiconductor laser.

However, according to the structure, it has been found that exfoliation of an optical fiber is caused by a mounting test by solder reflow (10 seconds at 260° C).

In producing a photo-electronic device, a case is formed to embed a portion of a lead frame by transfer mold. A base plate (pad) comprising a copper plate is formed at an inner bottom face of a case and a silicon substrate (thermal expansion $\alpha=3.0\times10^{-6}/°$ C.) is fixed onto the base plate. A semiconductor laser element, a light receiving element, an optical fiber and the like are fixed onto the silicon substrate. A front end portion of an optical fiber is positioned to face an emitting face of the semiconductor laser element and a front end portion thereof is adhered to the silicon substrate by an adhering agent. Further, a portion at a middle of the optical fiber is fixed to the case by an adhering agent.

Here, the optical fiber indicates also an optical fiber core line formed by a core and quartz covering the core and the optical fiber cable covering the optical fiber core line by a cover member of a jacket. When the optical fiber core line or the optical fiber cable may not be specified particularly or may not preferably be specified, these are referred to simply as optical fiber in the following.

When a constitution of supporting an optical fiber (optical fiber core line) is constructed by two points support constitution of fixing a front end portion of the optical fiber and a middle portion thereof, tensile force is operated to the optical fiber core line by thermal deformation of the base plate caused by heat in the solder mount test and the tensile force exceeds force of adhering the silicon substrate and the optical fiber core line and the optical fiber core line is exfoliated. Exfoliation of the optical fiber at the front end portion of the optical fiber causes a phenomenon in which a deterioration is caused in transmission and reception efficiency of light to and from the semiconductor laser element or light is not inputted at all from the front end.

In order to resolve such a problem, the applicants have investigated to form the lead frame by a material the thermal expansion coefficient of which is proximate to that of silicon. As a material the thermal expansion coefficient is proximate to that of silicon, there are kovar, 42 alloy and the like. Hence, the applicants have formed the lead frame by 42 alloy ($\alpha=5\times10^{-6}/°$ C.). Therefore, the base plate and the lead integrated to the case are made of 42 alloy. The thermal conductivity of 42 alloy is as small as 13.4 W/m·k in comparison with 146 W/m·k of Cu and achieves an effect of capable of restraining temperature rise of the base plate per se and restraining deformation of the base plate. Thereby, there is provided a structure in which the optical fiber is difficult to exfoliate.

Meanwhile, the applicants have investigated also on adaptability of resin constituting the case. Since the case is exposed to high temperature even in a short period of time, as a resin constituting the case, the resin having heat resistant temperature of 200° C. or higher has been investigated. Although as resins, there are thermoplastic resin and thermosetting resin, thermoplastic resin is used since thermosetting resin is provided with a drawback in which the time period of molding thereof is long and the resin is not reproducible. Thermoplastic resin is widely used as engineering plastic.

As resin having the heat resistant temperature equal to or higher than 200° C., there are polyphenylene sulphide (PPS), polyether sulfone (PES), polyetherketone (PEEK) and liquid crystal polymer (LCP).

PES, PEEK and LCP are expensive and PPS is balanced in view of heat resistance and price.

Although the price is high, the liquid crystal polymer (LCP) is featured in high heat resistance (thermal deformation temperature equal to or higher than 260° C.) and high bending strength (bending strength: 21.2 kg/mm² at 25° C.). Further, the liquid crystal polymer is particularly featured in small linear expansion coefficient in a direction of flow of resin in molding thereof. The linear expansion coefficient of the resin in the flow direction is $2.0\times10^{-6}/°$ C. and the linear expansion coefficient in a direction orthogonal to the flow is $66\times10^{-6}/°$ C.

Hence, the applicants have conceived to prevent breakage caused by the thermal stress of the optical fiber core line by molding the case by making the resin flow in the direction of extending the optical fiber core line and approximating the thermal expansion coefficient of the case in the direction of extending the optical fiber core line to the thermal expansion coefficient of the optical fiber core line.

However, in the case of the liquid crystal polymer, the thermal conductivity is as small as 0.4 W/m·k and the tensile strength of weld after molding is smaller than 25 MPa in comparison with 55 MPa or more of various engineering plastics. In order to improve the heat radiating performance, the thinner the resin thickness below the base plate fixed with the semiconductor laser element, that is, the thickness of the bottom of the case, the more preferable. However, as mentioned above, the liquid crystal polymer is provided with the low tensile strength of weld and the bottom of the case becomes brittle. Hence, the inventors have conceived to increase the strength by partially thickening the bottom of the case.

Meanwhile, it has been found that there is a case of breaking the optical fiber core line from the following reason by analysis and investigation by the inventors.

FIG. 21 is an enlarged sectional view showing a portion of a package 5 of a photo-electronic device according to an investigation by the applicants. The package 5 comprises a case 10 and a cap 11 adhered and fixed to overlap the case 10.

The case 10 comprises a case main body portion 10a and a slender case guide portion 10b continuous to the case main body portion 10a. The cap 11 comprises a cap main body portion 11a overlapping the case main body portion 10a and a cap guide portion 11b overlapping the case guide portion 10b.

The case main body 10a is constituted by a box type structure the upper portion of which is opened and is constituted by a structure in which a plurality of leads, not illustrated, constituting external electrode terminals are projected respectively from both sides thereof. A base plate 15 comprising a metal plate is provided at an inner bottom of the case main body portion 10a and a support substrate (silicon platform, not illustrated) is fixed onto the base plate 15.

The support substrate is fixed respectively with a semiconductor laser element, a light receiving element and a front end portion of an optical fiber core line 3a. Further, a gel-like resin 36 is filled in the case main body portion 10a for covering the semiconductor laser element, the light receiving element and the optical fiber core line.

The case guide portion 10b and the cap guide portion 11b are constructed by a structure of guiding an optical fiber cable and an optical fiber core line which becomes bare by removing a jacket (cover member) of the optical fiber cable. That is, match faces of the case guide portion 10b and the cap guide portion 11b are respectively provided with grooves. The grooves comprise cable guide grooves for guiding the optical fiber cable and core line guide grooves 10d and 11d continuous to the cable guide grooves. The cable guide grooves are extended from ends of the case guide portion 10b and the cap guide portion 11b to middle portions thereof and remaining portions constitute the core line guide grooves 10d and 11d. The optical fiber cable is constructed by a structure of covering the optical fiber core line 3a comprising the core and the clad by a cover member (jacket). Therefore, the optical fiber cable integrated to the photo-electronic device is brought into a state of the optical fiber core line 3a by removing the jacket over a predetermined length at the front end side.

The case guide portion 10b and the cap guide portion 11b are inserted with the portion of the optical fiber core line 3a and the portion of the optical fiber cable and the portions are fixed to the case guide portion 10b and the cap guide portion 10b via an adhering agent 38. Further, the front end portion of the optical fiber core line 3a is fixed to the silicon platform via an adhering agent.

It has been found that according to such a structure, there is a case in which optical transmission cannot be carried out by causing a disconnection failure of the optical fiber core line 3a inserted into the case guide portion 10b and the cap guide portion 11b.

The following has been found as a result of analyzing and investigating the point. That is, in forming the gel-like resin 36, silicone resin having fluidity is supplied to the case main body portion 10a and the silicone resin flows into a clearance between the outer peripheral portion of the optical fiber core line 3a and the core line guide groove 10d. As a result, the gel-like resin 36 and the adhering agent 38 are brought into contact with each other over a long distance in the core line guide groove 10d and 11d.

The gel-like resin 36 uses the silicone resin and the adhering agent 38 uses epoxy resin of amine species. Further, an adhering agent for fixing the case 10 and the cap 11 also uses the epoxy resin of amine species. The epoxy resin of amine species is used since force thereof of adhering to the plastic case is excellent. However, adhering performance between the gel-like silicone resin and the epoxy resin of amine species or the plastic case is not excellent.

As a result, it has been found that since the optical fiber is not fixed to the case guide portion, there causes a phenomenon in which tensile stress is operated to the optical fiber core line 3a owing to temperature change and the optical fiber core line 3a is broken.

Further, it has been also found that in the case in which moisture is stored at the interface 7, when the photo-electronic device is used in a cold district, there causes a phenomenon in which the moisture stored at the interface constitutes ice and the optical fiber core line is broken by an increase in the volume. The breakage is particularly easy to occur when the interface is disposed at an area of the case guide portion 10b and the cap guide portion 11b.

It is an object of the invention to provide a photo-electronic device capable of preventing an optical fiber from being broken and a method of producing thereof.

It is other object of the invention to provide a photo-electronic device having high efficiency of optically coupling a photoelectric conversion element and an optical fiber and a method of producing thereof.

It is other object of the invention to provide a photo-electronic device having high heat radiating performance and a method of producing thereof.

The above-described and other objects and novel features of the invention will become apparent from description of the specification and attached drawings.

A simple explanation will be given of an outline of representative aspect of the invention disclosed in the application as follows.

(1) According to an aspect of the invention, there is provided a photo-electronic device including a package having a main body portion containing parts including a photoelectric conversion element at inside thereof and a guide portion a front end of which faces the photoelectric conversion element for guiding, in a penetrated state, an optical fiber for transmitting and receiving light to and from the photoelectric conversion element, in which the optical fiber is fixed to the guide portion by an adhering agent at the guide portion and portions of the main body portion including the photoelectric conversion element and a front end portion of the optical fiber are covered by a protective film formed by a resin transparent to the light and a dam is provided between the protective film and the adhering agent such that the protective film and the adhering agent are not brought into contact with each other.

According to another aspect of the invention, there is provided the photo-electronic device, wherein the package is formed by a case and a cap adhered to overlap the case, the case is formed by a case main body portion and a case guide portion continuous to the case main body portion, the cap is formed by a cap main body portion and a cap guide portion continuous to the cap main body portion, the case main body is portion is embedded with a predetermined shape of a metal plate a portion of which forms a base plate exposed to an inner bottom of the main body portion, remaining portions of which form a plurality of leads extended to inside and outside of the main body portion, a support substrate (silicon substrate: silicon platform) is fixed onto the base plate and the photoelectric conversion element and the optical fiber for transmitting and receiving light to and from the photoelectric conversion element are fixed onto the support base plate.

The support substrate is fixed with a semiconductor laser element, a light receiving element and the front end portion of the optical fiber, the optical fiber is positioned and fixed to input laser beam on one side emitted from the semiconductor laser element from a front end to an inner portion thereof and the light receiving element is positioned and fixed to receive laser beam on other side emitted from the semiconductor laser element. Further, the front end portion of the optical fiber is fixed to the support substrate by an ultraviolet ray cured adhering agent and is fixed to the support substrate by a thermosetting adhering agent.

The protective film is formed by a gel-like resin, the adhering agent is formed by epoxy resin of amine species and the dam is formed by an ultraviolet ray cured adhering agent of epoxy resin species. Further, there is present an air gap at a portion of the main body portion above the protective film.

The metal plate forming the base plate or the leads is formed by 42 alloy or kovar the thermal expansion coefficient of which is proximate to the thermal expansion coefficient of the support substrate or the optical fiber and the case and the cap constituting the package are formed by a resin (liquid crystal polymer) in which the thermal expansion coefficient in the direction along the flow of resin in molding becomes smaller than the thermal expansion coefficient in a direction orthogonal to the flow direction and the case and the cap are molded such that the thermal expansion coefficients in the direction of extending the optical fiber are reduced.

A peripheral edge portion of a bottom of the case main body portion of the case formed by the resin, is projected to thicken more than an inner side portion thereof and at the center of the base plate, the resin is not provided over a predetermined length along the direction of extending the optical fiber and the rear face of the base plate is exposed. The peripheral edge portion of the bottom of the main body portion of the package is projected to thicken more than the inner side portion.

Such a photo-electronic device is produced by the following method.

According to another aspect of the invention, there is provided a method of producing a photo-electronic device in which a package is formed by a case and a cap adhered to overlap the case, the case is formed by a case main body portion and a case guide portion continuous to the case main body portion, the cap is formed by a cap main body portion and a cap guide portion continuous to the cap main body portion, the case main body portion is embedded with a predetermined shape of a metal plate a portion of which forms a base plate exposed to an inner bottom of the case main body portion and remaining portions of which form a plurality of leads extended to inside and outside of the case main body portion, a support substrate (silicon substrate: silicon platform) is fixed onto the base plate, a photoelectric conversion element an electrode of which is connected electrically to the lead is fixed onto the support substrate, an optical fiber is supported by the guide portion in a penetrated state and fixed thereto by an adhering agent, a front end of the optical fiber is fixed to the support substrate to transmit and receive light to and from the photoelectric conversion element and a protective film which is transparent to the light covers the photoelectric conversion element and the optical fiber in the main body portion, the method comprising the steps of fixing the support substrate fixed with the photoelectric conversion element to inside of the main body portion, fixing a front end portion of the optical fiber by an adhering agent, forming the protective film by filling a resin in the main body portion, and fixing the optical fiber to the guide portion by an adhering agent, wherein a dam is formed at a boundary portion of the main body portion and the guide portion such that the protective film does not invade the guide portion prior to forming the protective film.

According to another aspect of the invention, there is provided the method of producing a photo-electronic device wherein a semiconductor laser element is fixed to the support substrate, the front end portion of the optical fiber is positioned and fixed such that laser beam on one side emitted from the semiconductor laser element is inputted from a front end thereof to an inner portion thereof and a light receiving element is positioned and fixed to receive the laser beam on other side emitted from the semiconductor laser element. After optical couple adjustment of the optical fiber, the front end portion of the optical fiber is coupled by the ultraviolet ray cured adhering agent and is fixed thereto by the thermosetting adhering agent.

The case is formed by fastening a lead frame to mold dies of transfer mold and thereafter molding liquid crystal polymer resin to flow from one end portion to other end portion of the case and cutting and removing an unnecessary portion of the lead frame. In the transfer mold, the molding operation is carried out by pressing a portion of the lead frame constituting the base plate to a mold upper die by a pressure pin, the pressure pin is extended over a predetermined length along the direction of extending the optical fiber at the center of the base plate, the flowing resin is divided at one end side of the pressure pin and flows along both sides of the pressure pin and thereafter merges again on other end side of the pressure pin to flow. The case main body portion of the case is molded such that the resin thickness at the peripheral edge of the bottom thereof is thickened. The lead frame is formed by 42 alloy or kovar.

The protective film is formed by a gel-like resin which is transparent to the light, the adhering agent for fixing the optical fiber to the case guide portion is formed by epoxy resin of amine species and the dam is formed by an ultraviolet ray cured adhering agent of epoxy resin species.

According to the means of (1):

(a) Since the dam is present, the silicone resin does not flow out to the case guide portion by riding over the dam. Therefore, the epoxy resin of amine species having poor adhering performance with the silicone resin, is not brought into contact with the silicone resin, the case guide portion is filled with the epoxy resin of amine species, the force of adhering the case and the cap is also maintained and accordingly, the fiber can firmly be fixed, thermal stress caused by thermal variation is difficult to apply to the optical fiber (optical fiber core line), the optical fiber core line is difficult to break and optical transmission failure is difficult to cause.

(b) The thermal expansion coefficient of the case and the cap in the direction of extending the optical fiber is $4.0\times10^{-4}/^\circ$ C. (liquid crystal polymer), the thermal expansion coefficient of the base plate comprising 42 alloy is $5\times10^{-6}/^\circ$ C., the thermal expansion coefficient of the silicon platform is $3.0\times10^{-6}/^\circ$ C., the thermal expansion coefficient of the optical fiber core line is $0.5\times10^{-6}/^\circ$ C., all of the coefficients are smaller than that of copper ($a=17\times10^{-6}/^\circ$ C.) and are provided with numerical values proximate to each other and therefore, it is difficult to cause exfoliation of the optical fiber fixed by the silicon platform and the case guide portion owing to deformation of the base plate. Further, the front end portion of the optical fiber is fixed to the support substrate respectively by the ultraviolet ray cured adhering agent and the thermosetting adhering agent and accordingly, the adhering strength is high and exfoliation of the optical fiber is difficult to cause. As a result, at the front end of the optical fiber, a deterioration in the transmission and reception efficiency of light between the front end and the semiconductor laser element, is not caused and the optical fiber (optical fiber core line) is difficult to break at the case guide portion.

(c) Liquid crystal polymer (LCP) is featured in high thermal resistance (thermal deformation temperature equal to or higher than 260° C.) and high bending strength (bending strength: 21.1 kg/mm$^2$ at 25° C.), however, the tensile strength of weld after molding is small. Therefore, when the resin thickness (liquid crystal polymer thickness) below the base plate is thinned in order to improve heat radiating performance, the resin becomes brittle and easy to break, however, increase in the strength is achieved by thickening the peripheral edge of the bottom of the case and accordingly, there is constituted the package having high reliability of mechanical strength.

(d) Since the air gap is present at an upper portion of the protective film, even when the protective film is expanded by heat, the expanded portion elongates only to the air gap portion and is not brought into contact with the cap on the upper side and accordingly, stress is not applied to the optical fiber by deforming the package and the optical fiber is difficult to break.

DETAILED DESCRIPTION OF THE PREFERRED EMBODIMENTS

A detailed explanation will be given of embodiments of the invention in reference to the drawings as follows. Further, in all the drawings for explaining embodiments of the invention, portions having the same functions are attached with the same notations and a repetitive explanation thereof will be omitted.

(Embodiment 1)

FIG. 1 through FIG. 20 are views related to a photo-electronic device and a method of producing thereof according to an embodiment (Embodiment 1) of the invention.

Figure 2:
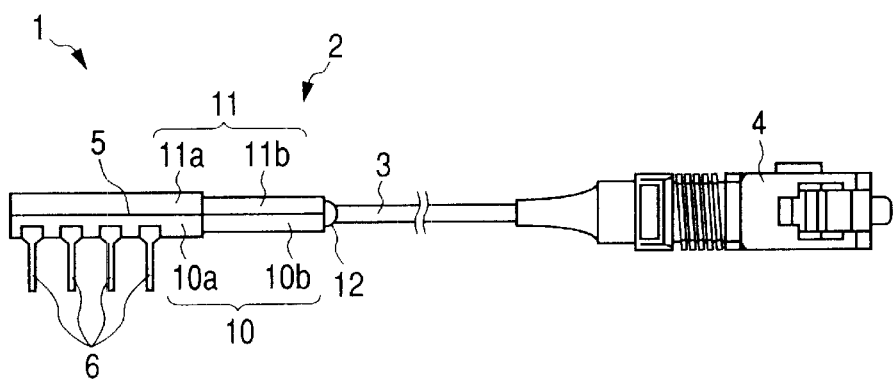
FIG. 2 is a front view of the photo-electronic device according to Embodiment 1.
Figure 3:
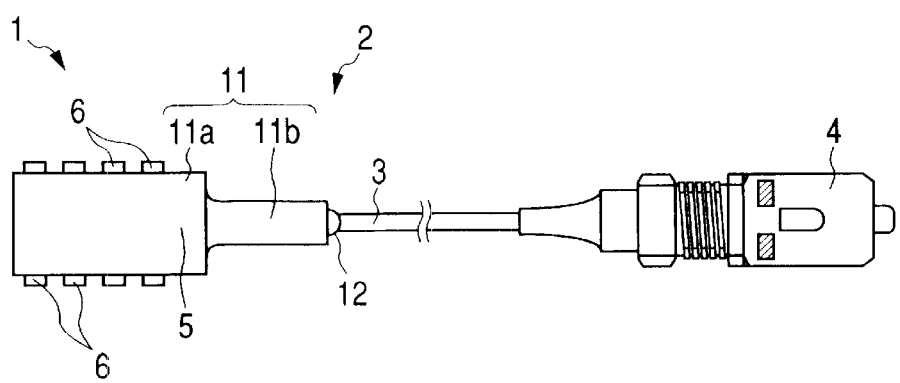
FIG. 3 is a plane view of the photo-electronic device according to Embodiment 1.

As shown by FIG. 2 and FIG. 3, a photo-electronic device (semiconductor optical module) 1 according to Embodiment 1, comprises a module main body 2 and an optical connector 4 attached to a front end of an optical fiber cable 3 constituting the module main body 2 in its outlook.

Figure 4:
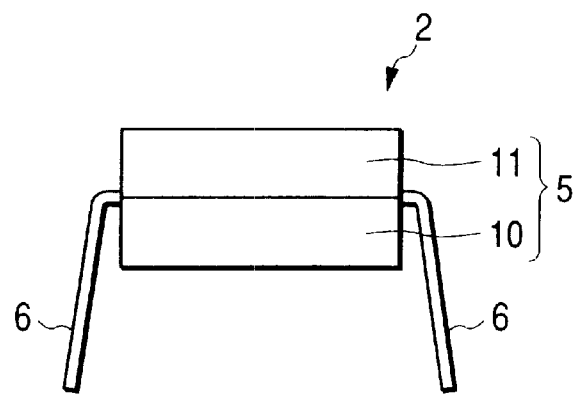
FIG. 4 is a side view of the photo-electronic device according to Embodiment 1.

The module main body 2 comprises the package 5 having a flat parellelepiped structure, the optical fiber cable 3 projected from one end of the package 5 and leads 6 constituting a plurality of external electrode terminals projected to align from both sides of the package 5. As shown by FIG. 4, according to Embodiment 1, the leads 6 are formed in dual in line type. According to Embodiment 1, there is constructed a structure in which four pieces of the leads 6 are respectively projected from the both sides of the package 5.

Figure 5:
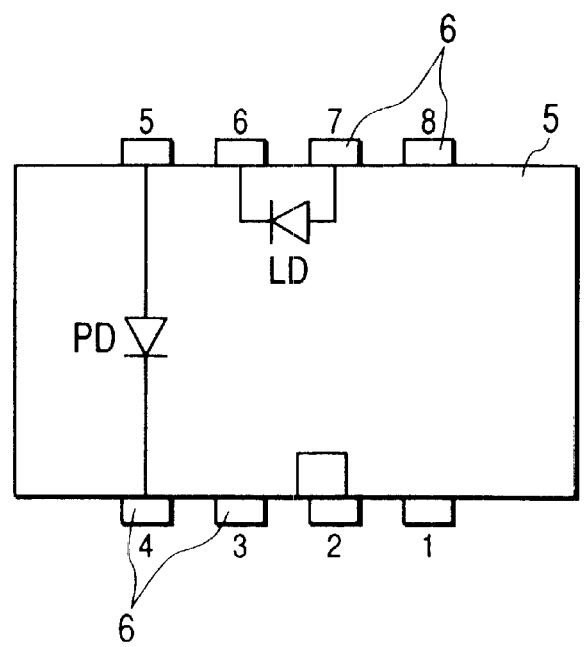
FIG. 5 is a schematic view showing pin layout of the photo-electronic device according to Embodiment 1.

FIG. 5 is a schematic view showing layout of the leads 6. A semiconductor laser element (laser diode: LD) and a light receiving element (photodiode: PD) are integrated in the package 2. In FIG. 5, numerals 1 through 8 are attached to the leads 6. The leads of 1, 3, 8 are NC pins not connected, the lead of 2 is a package ground pin, the lead of 4 is a cathode pin of a photodiode, the lead of 5 is an anode pin of the photodiode, the lead of 6 is a cathode pin of the laser diode and the lead of 7 is an anode pin of the laser diode.

Therefore, when predetermined voltage is applied across the leads of 6 and 7, the laser diode emits laser beam. The laser beam is transmitted to outside of the package 5 by the optical fiber cable 3 and is transmitted to an optical fiber cable, not illustrated, connected by the optical connector 4.

The package 5 is formed by a case 10 made of plastic (resin) and a cap 11 made of plastics fixed onto the case 10. The case 10 is constituted by a case main body portion 10a in a rectangular shape and a case guide portion 10b projected from center of one end of the case main body portion 10a in a slender shape and the cap 11 is constituted by a cap main body portion 11a in a rectangular shape and a cap guide portion 11b projected from center of one end of the cap main body portion 11a in a slender shape. Therefore, when the cap 11 is adhered to fix to the case 10, a main body portion thereof is formed by the case main body portion 10a and the cap main body portion 11a and a guide portion thereof is formed by the case guide portion 10b and the cap guide portion 11b. The case 10 and the cap 11 are formed by liquid crystal polymer comprising insulating resin.

The semiconductor laser element and the light receiving element are arranged in the case main body portion 10a. Further, the guide portion, that is, the case guide portion 10b and the cap guide portion 11b, in the adhered state, are constructed by a structure for guiding, in a penetrated state, an optical fiber cable and an optical fiber core line (comprising a clad and a core penetrating center of the clad) which becomes bare by removing a jacket (cover member) of the optical fiber cable. A portion of the optical fiber cable 3 projected from the case guide portion 10b and the cap guide portion 11b, is fixed by an adhering agent 12. The adhering agent 12 is for tacking the optical fiber cable 3 to the case guide portion 10b.

Figure 6:
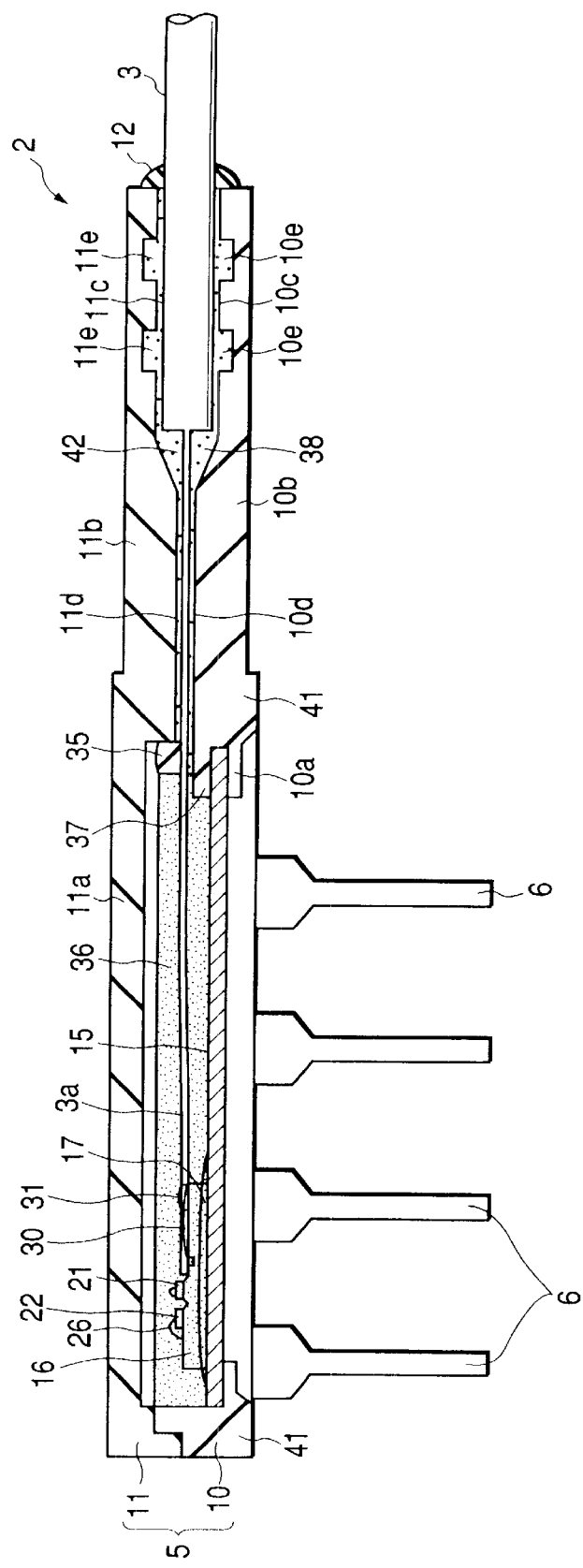
FIG. 6 is an enlarged sectional view of the photo-electronic device according to Embodiment 1 along a direction of extending an optical fiber.
Figure 7:
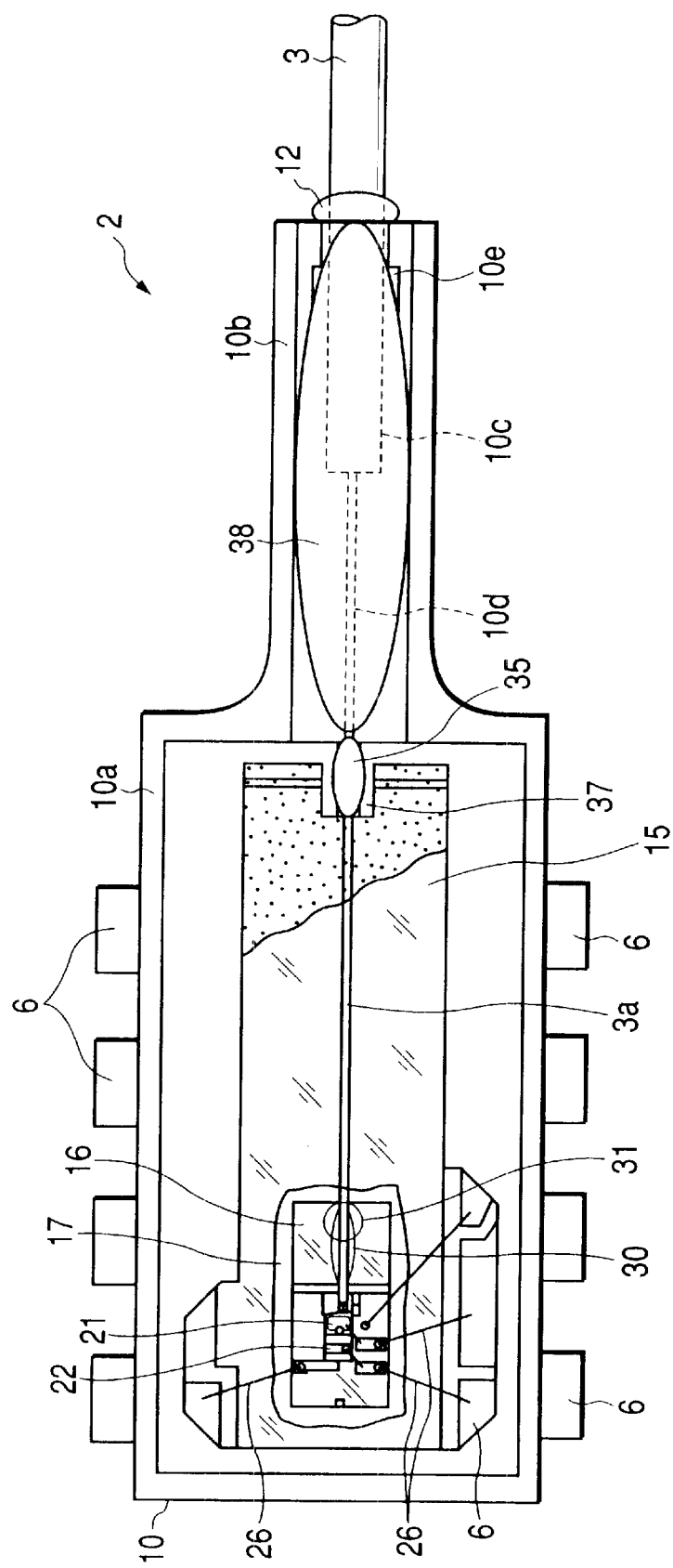
FIG. 7 is an enlarged plane view in a state of removing a cap of the photo-electronic device according to Embodiment 1.
Figure 8:
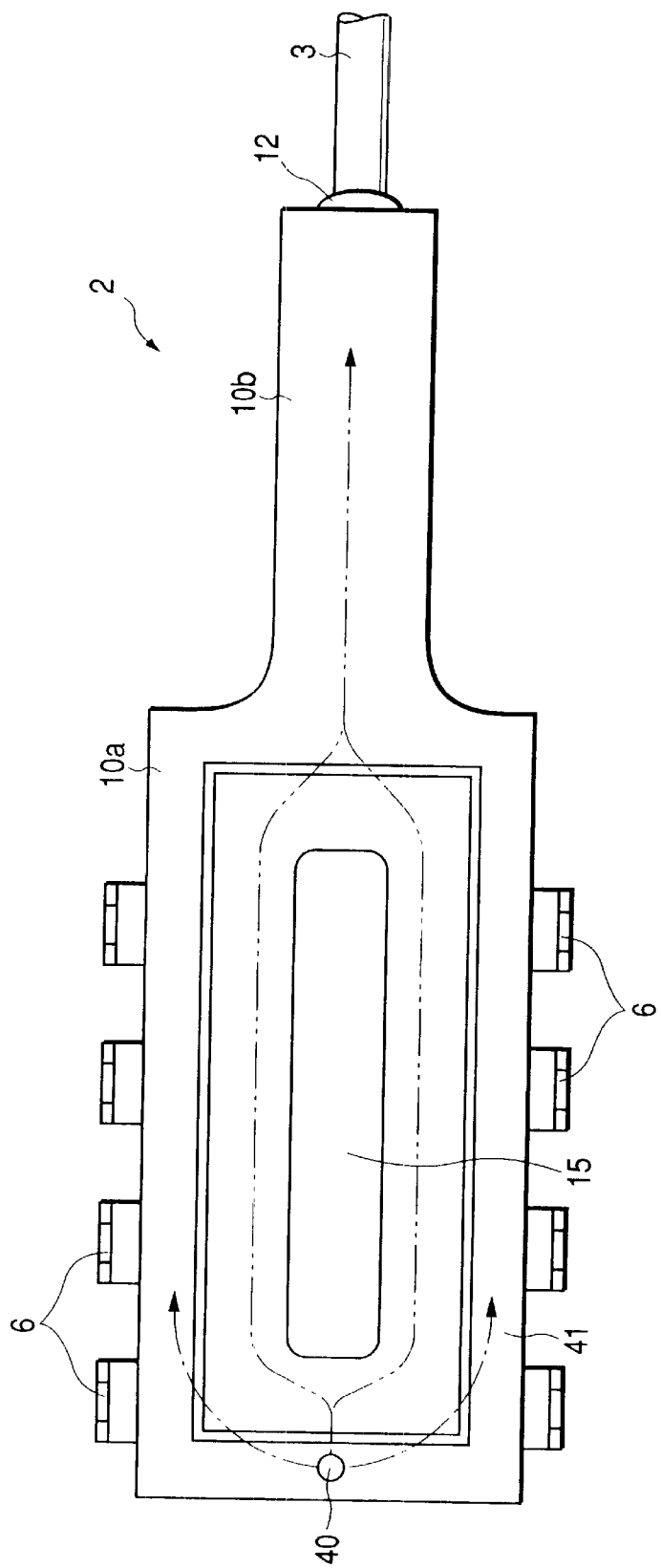
FIG. 8 is an enlarged bottom view showing a portion of the photo-electronic device according to Embodiment 1.
Figure 9:
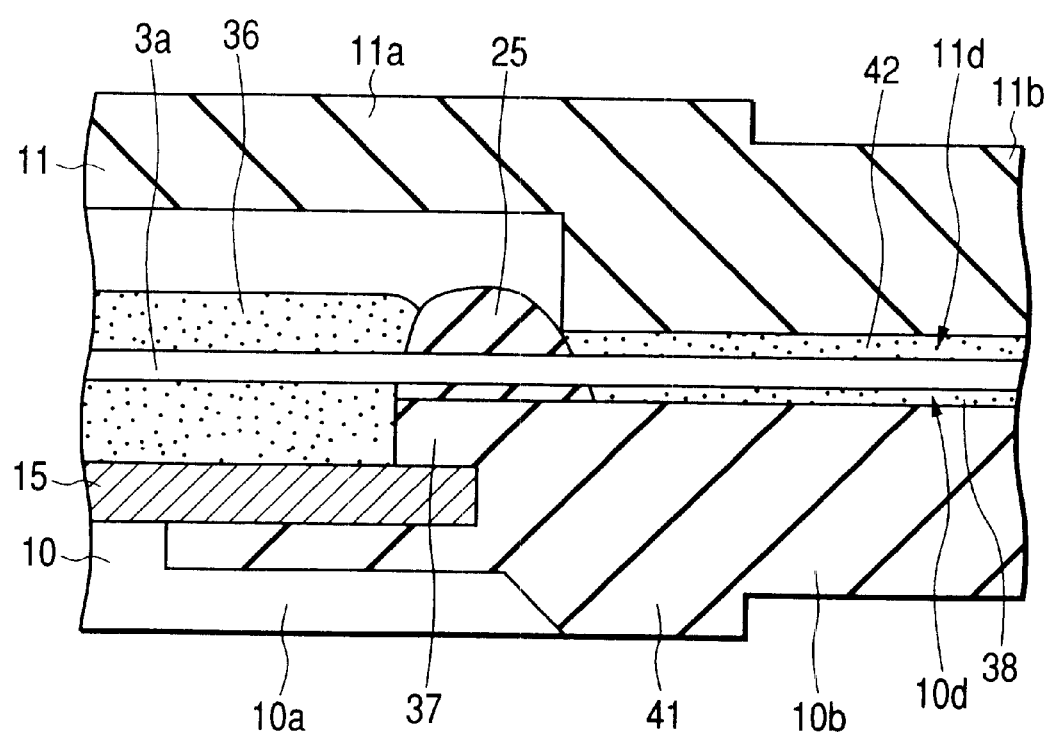
FIG. 9 is an enlarged sectional view showing a portion of the photo-electronic device according to Embodiment 1.
Figure 10:
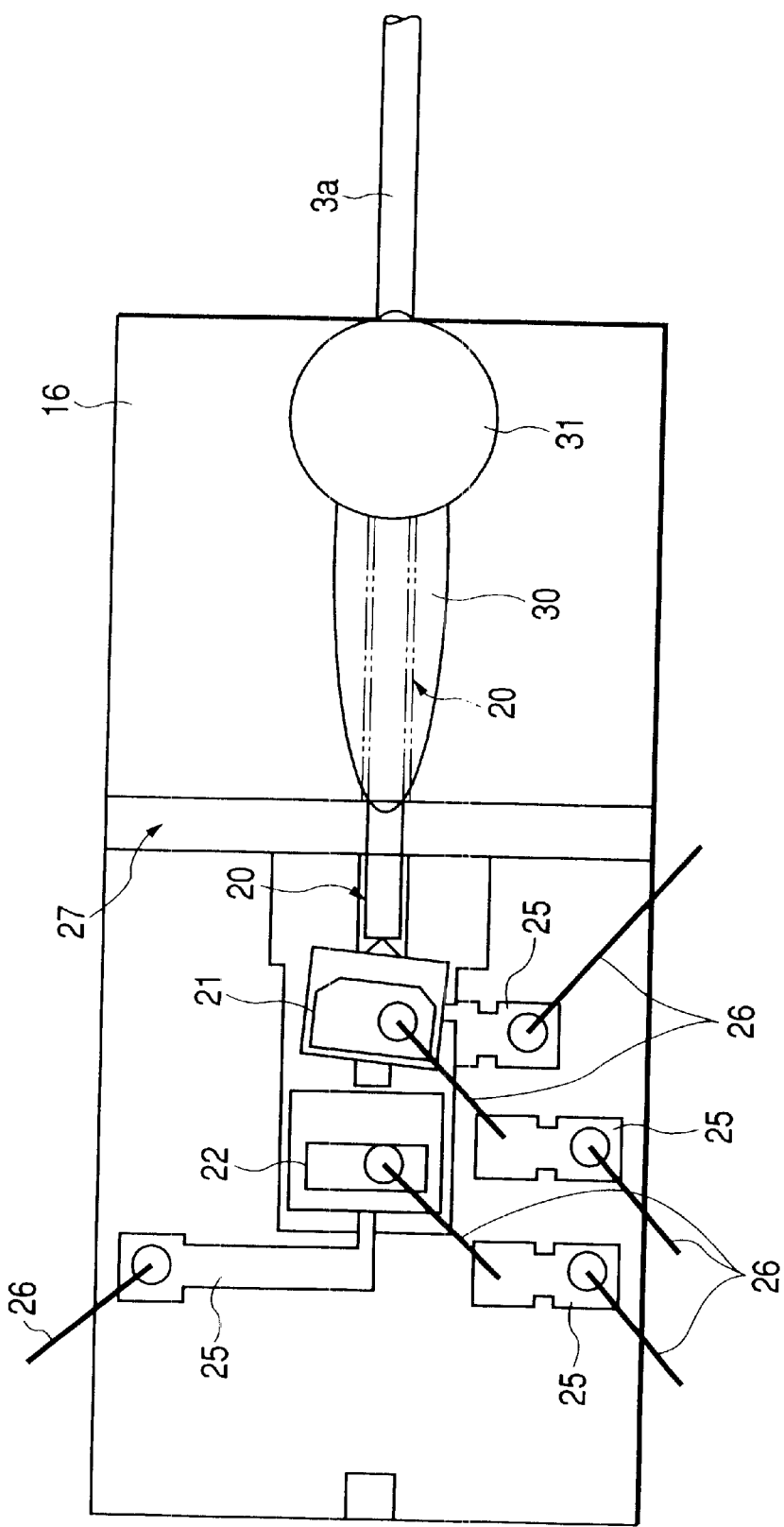
FIG. 10 is an enlarged plane view of a silicon substrate portion in the photo-electronic device according to Embodiment 1.

Next, an explanation will be given of the module main body 2 in reference to FIG. 1 and FIG. 6 through FIG. 10. FIG. 6 is an enlarged sectional view of the module main body 2 along a direction of extending the optical fiber, FIG. 7 is an enlarged plane view of the module main body 2 in a state of removing the cap 11 and FIG. 8 is a bottom view thereof. Further, FIG. 9 is an enlarged sectional view showing a structure of supporting the optical fiber core line at a boundary portion of the case main body portion 10a and the case guide portion 10b and FIG. 10 is an enlarged plane view showing a support substrate and optical parts fixed to the support substrate.

As shown by FIG. 6 and FIG. 7, a base plate 15 comprising a metal plate is provided at an inner bottom of the case main body portion 10a. Further, inner ends of the leads 6 are respectively disposed at a surrounding of the base plate 15. The base plate 15 and the leads 6 are integrated to the case 10 in molding the case 10.

The optical fiber cable 3 is guided to the case guide portion 10b and a support substrate 16 comprising a silicon substrate generally referred to as silicon platform, is fixed over the base plate 15 on an extension line of the optical fiber axis of the optical fiber cable 3 by a bonding member 17, for example, silver paste.

The optical fiber cable 3 is covered with a cover member (jacket) made of nylon. Although the cover member is present up to a middle of the case guide portion 10b of the case 10, at a front end side thereof, the cover member is stripped and an optical fiber core line 3a comprising the core and the clad is exposed. As shown by FIG. 10, the portion of the optical fiber core line 3a is fitted to creep in a groove 20 provided at the support substrate (silicon platform) 16. Further, there is constructed a structure in which a semiconductor laser element (semiconductor laser chip) 21 as a photoelectric conversion element and a light receiving element (photodiode) 22 are fixed to align in series onto the silicon platform 16 on an extension thereof.

Laser beam (one laser beam) emitted from one emitting face of the semiconductor laser element 21 is inputted into the optical fiber from a front end of the optical fiber core line 3a and laser beam (other laser beam) emitted from other emitting face thereof is received by the light receiving element 22 to monitor an optical output intensity.

As shown by FIG. 10, one face of the silicon platform 16 is provided with patterned conductive metallized layers 25. The metallized layers 25 constitute bonding pads for connecting mounting portions for mounting the semiconductor laser element 21 and the light receiving element 22 or conductive wires. Further, the semiconductor laser element 21 and the light receiving element 22 are fixed onto the mounting portions via conductive adhering layers. Both of the semiconductor laser element 21 and the light receiving element 22 are provided with electrodes at upper faces and lower faces thereof and accordingly, the lower electrodes are respectively connected electrically to the predetermined metallized layers 25.

As shown by FIG. 6 and FIG. 7, portions of the metallized layers continuous to the mounting portions and inner end portions of the predetermined leads 6 are connected by conductive wires 26. Further, the upper face electrodes of the semiconductor laser element 21 and the light receiving element 22 are fixed to the metallized layers independent from each other respectively via the conductive wires 26 and portions of the metallized layers are electrically connected to the inner end portions of the predetermined leads 6 via the wires 26.

Further, there is provided a discharge groove 27 to intersect the groove 20 provided at the one face of the silicon platform 16 (refer to FIG. 10). Although the optical fiber core line 3a (optical fiber) is brought into a state of passing over the discharge groove 27, a length of the optical fiber core line 3a which passes over the discharge groove 27 and projected, is extremely short. For example, the projected length is about 100 μm. Further, the diameter of the optical fiber core line 3a, that is, the diameter of the clad is, for example, about 125 μm.

As shown by FIG. 10, at a vicinity of the discharge groove 27, the optical fiber core line 3a is fixed to the silicon platform 16 by fixing by two kinds of adhering agents of a primary fixing portion 30 and a secondary fixing portion 31. The primary fixing portion 30 is constituted by an ultraviolet ray cured adhering agent and the secondary fixing portion 31 is constituted by a thermosetting resin.

As shown by FIG. 10, the primary fixing portion 30 is formed in a slender shape along the optical axis of the optical fiber core line 3a. The optical fiber core line 3a is inserted and positioned to creep in the groove 20, thereafter, the ultraviolet ray cured adhering agent is coated and thereafter, ultraviolet ray is irradiated to cure the ultraviolet ray cured adhering agent and carry out primary fixing (tacking). The optical fiber core line 3a is firmly fixed to the silicon platform 16 by the primary fixing. Therefore, thereafter, there is carried out secondary fixing constituting full fixing. The secondary fixing is carried out by coating the thermosetting resin at a portion of the optical fiber fixed by the primary fixing portion 30 remote from the semiconductor laser element 21 and curing the resin thereafter. The tar secondary fixing processing can be carried out in batch and the productivity can be promoted.

In the primary fixing processing and the secondary fixing processing, as a standard, adhering agents of the ultraviolet ray cured adhering agent and the thermosetting resin are coated not to ride over the discharge groove 27. The adhering agent which enters the discharge groove 27 is guided to side portions of the silicon platform 16 via the discharge groove 27 and accordingly, the adhering agent does not enter between the front end face of the optical fiber core line 3a and the emitting face of the semiconductor laser element 21 and transmission and reception of light is not hampered.

Meanwhile, a gel-like resin showing a rubber characteristic is filled in the case main body portion 10a to thereby form a protective film 36. The protective film 36 is a protective member which is not only transparent to the laser beam to prevent transmission loss of the laser beam which is emitted from the semiconductor laser element 21 and reaches the front end of the optical fiber core line 3a but also excellent in humidity resistance. The protective film 36 covers the base plate 15, the silicon platform 16, the optical fiber core line 3a, the semiconductor laser element 21 and the light receiving element 22 to thereby achieve promotion of humidity resistance of the semiconductor laser element 21 and the light receiving element 22.

Figure 1:
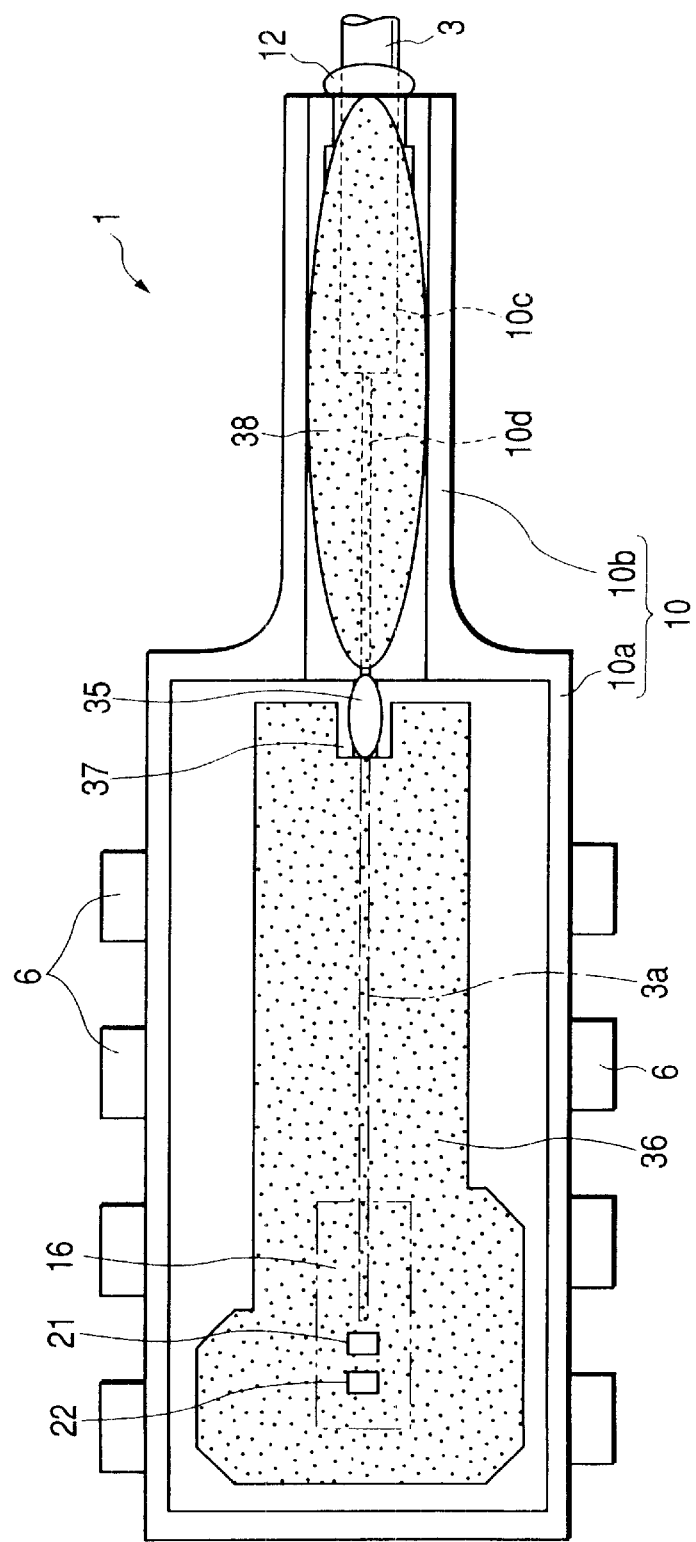
FIG. 1 is a schematic plane view showing a structure of preventing contact between gel-like resin and amine species epoxy resin by a dam in a photo-electronic device according to an embodiment (Embodiment 1) of the invention.

On the other hand, as shown by FIG. 1, FIG. 6 and FIG. 7, there are respectively provided grooves at match faces of the case guide portion 10b and the cap guide portion 11b. The grooves comprise cable guide grooves 10c and 11c for guiding the optical fiber cable 3 and core line guide grooves 10d and 11d continuous to the cable guide grooves 10c and 11c.

The cable guide grooves 10c and 11c are extended from ends to middles of the case guide portion 10b and the cap guide portion 11b and remaining portions thereof constitute the core line guide portions 10d and 11d. The cable guide grooves 10c and 11c are provided with grooves 10e and 11e in the peripheral direction in order to increase strength of fixing the optical fiber cable 3 by filling the resin by a larger amount.

Further, as one of characteristics of the invention, there is formed a dam 35 by resin at front end portions (inner end portions) of the core line guide grooves 10d and 11d on the side of the semiconductor laser element 21. The dam 35 is formed by dripping of resin and processing to cure thereof to fill up an outer peripheral clearance of the optical fiber core lines 3a inserted into the cores line guide grooves 10d and 11d and serves as a dam for preventing silicone resin filled in the case main body portion 10a from invading the case guide portion 10b and the cap guide portion 11b via the outer peripheral clearance of the optical fiber core line 3a in filling thereof.

In order to promote the dam effect, there is adopted a structure in which an inner end of the core line guide groove 10d is projected to the center side of the case main body portion longer than the core line guide groove 11d. Therefore, in dripping the resin when the dam 35 is formed, the resin is mounted also on the projected portion 37 and as shown by FIG. 9, there is formed the dam 35 which is slightly elevated and in filling the resin for forming the protective film 36, the resin can be prevented from invading.

Adhering agents 38 and 42 are filled in the core line guide grooves 10d and 11d and the cable guide grooves 10c and 11c outward from the protective film 36 to thereby fix the optical fiber core line 3a and the optical fiber cable 3.

The protective film 36 is formed by, for example, transparent silicone resin capable of transmitting laser beam ($\alpha=4.0\times10^{-4}/°$ C.). The adhering agents 38 and 42 are formed by amine species epoxy resin. The dam 35 is used for separating the protective film 36 and the adhering agents 38 and 42 comprising the amine species epoxy resin. For example, the dam 35 is formed by, for example, an ultraviolet ray cured adhering agent of epoxy resin species ($\alpha=6.2\times10^{-5}/°$ C.)

Further, the protective film 36 is not limited to silicone gel but may be formed by silicone rubber, low stress epoxy resin, acrylic resin or urethane resin any of which is transparent.

Since the dam 35 is present in this way, the protective film 36 comprising the gel-like resin provided at the main body portion, is not brought into contact with the adhering agent 38 for fixing the optical fiber to the guide portion and accordingly, thermal stress caused by thermal variation becomes difficult to apply to the optical fiber core line, breakage of the optical fiber core line is difficult to cause and failure in optical transmission is difficult to cause.

The resin for forming the dam 35 comprises epoxy resin of an ultraviolet ray cured type and therefore, the resin can be cured by steps the same as the steps of irradiating ultraviolet ray in fixing the optical fiber to the silicon substrate.

The amine species epoxy resin is used for the adhering agents 38 and 42 by the following reason. That is, the adhering force for adhering to a plastic case is excellent. The kind of the adhering agent is not limited so far as the force of adhering to the plastic case can be maintained.

FIG. 1 is a plane view of the photo-electronic device 1 in a state before attaching the cap 11 to the case 10. According to the drawing, a state in which the protective film 36 and the adhering agent 38 are not brought into direct contact with each other by the presence of the dam 35, is apparent. Further, FIG. 7 is illustrated by removing a portion of the protective film 36.

Further, the case 10 is fixed with the cap 11 by the adhering agent 42. Epoxy resin of amine species having a material the same as that of the adhering agent 38 is used for the adhering agent. At the case guide portion 10b and the cap guide portion 11b, the adhering agent 42 overlaps the adhering agent 38.

According to Embodiment 1, the base plate 15 and the leads 6 integrated to the case 10, are formed by 42 alloy having thermal expansion coefficient ($\alpha=5\times10^{-6}/$ ° C.) proximate to thermal expansion coefficient of silicon ($\alpha=3.0\times10^{-6}/°$ C.) or quartz ($\alpha=0.5\times10^{-6}/°$ C.) constituting the optical fiber core line 3a and the case 10 and the cap 11 formed by transfer mold, are formed by anisotropic liquid crystal polymer. That is, thermal expansion coefficient of the liquid crystal polymer in a direction of flow of resin in transfer mold, s as small as $2.2\times10^{-6}/°$ C. and is proximate to the thermal expansion coefficient of silicon or quartz. Hence, the case 10 is formed to make resin flow along the direction of extending the optical fiber. FIG. 8 shows a gate mark 40 in transfer mold and flow of resin in transfer mold (indicated by arrow marks). In transfer mold, a pressure pin is brought into contact with a rear face side of the base plate 15 and therefore, after transfer mold, the base plate 15 is exposed as shown by FIG. 8, the exposed portion becomes a slender region and is provided with a wide area and accordingly, heat radiating performance is further improved.

The case 10 and the cap 11 are formed by the liquid crystal polymer, the base plate 15 is formed by 42 alloy, the thermal expansion coefficients of the package 5 and the base plate 15 in the direction of extending optical fiber, are proximate to the thermal expansion coefficient of the optical fiber core line and accordingly, the optical fiber core line portion fixed to the silicon platform 16 fixed to the base plate 15 and the optical fiber core line portion fixed to the case guide portion 10b and the cap guide portion 11b are difficult to exfoliate by heat in mounting the photo-electronic device 1 and a deterioration in an efficiency of optically coupling the semiconductor laser element 21 and the optical fiber core line 3a, is difficult to cause. Further, it is difficult to cause disconnection failure of the optical fiber core line 3a which is caused since the optical fiber core line 3a is not fixed.

Although according to Embodiment 1, by thinning the thickness of the case 10 below the base plate 15 (for example, 0.25 mm) to thereby increase an effect of irradiating heat to the atmosphere, as mentioned above, tensile strength of weld of liquid crystal polymer is low. Therefore, when the thickness of the liquid crystal polymer at the bottom of the case 10 is thinned, the case 10 becomes brittle and the mechanical strength is reduced and therefore, as shown by FIG. 6, FIG. 8 and FIG. 9 (refer to FIG. 13), ribs 41 are formed by thickening peripheral edge portions. For the purpose of reinforcement to promote the strength, there may be constructed not only the structure of only thickening the peripheral edge in this way but also a structure of partially thickening thereof or a structure of providing a plurality of thick portions.

Thereby, the mechanical strength of the package 5 can be promoted, the reliability of the package can be promoted and long life of the photo-electronic device 1 can be achieved.

Next, an explanation will be given of a method of producing the photo-electronic device (semiconductor optical module) 1.

At first, respective parts or assembled articles are prepared. That is, there are prepared the case 10 made of plastics with guide for guiding the optical fiber and the cap 11 made of plastics attached to close the case 10, the silicon platform 16 mounted with the semiconductor laser element 21 and the light receiving element 22 at the one face and having the groove 20 extended toward the semiconductor laser element 21 and so on. The case 10 and the cap 11 are provided with the above-described structures.

Although as described above, the silicon platform 16 is fixed with the semiconductor laser element 21 and the light receiving element 22 as shown by FIG. 10, at this stage, the silicon platform 16 is not fixed with the optical fiber core line 3a and connection by the wires 26 is not carried out.

Figure 11:
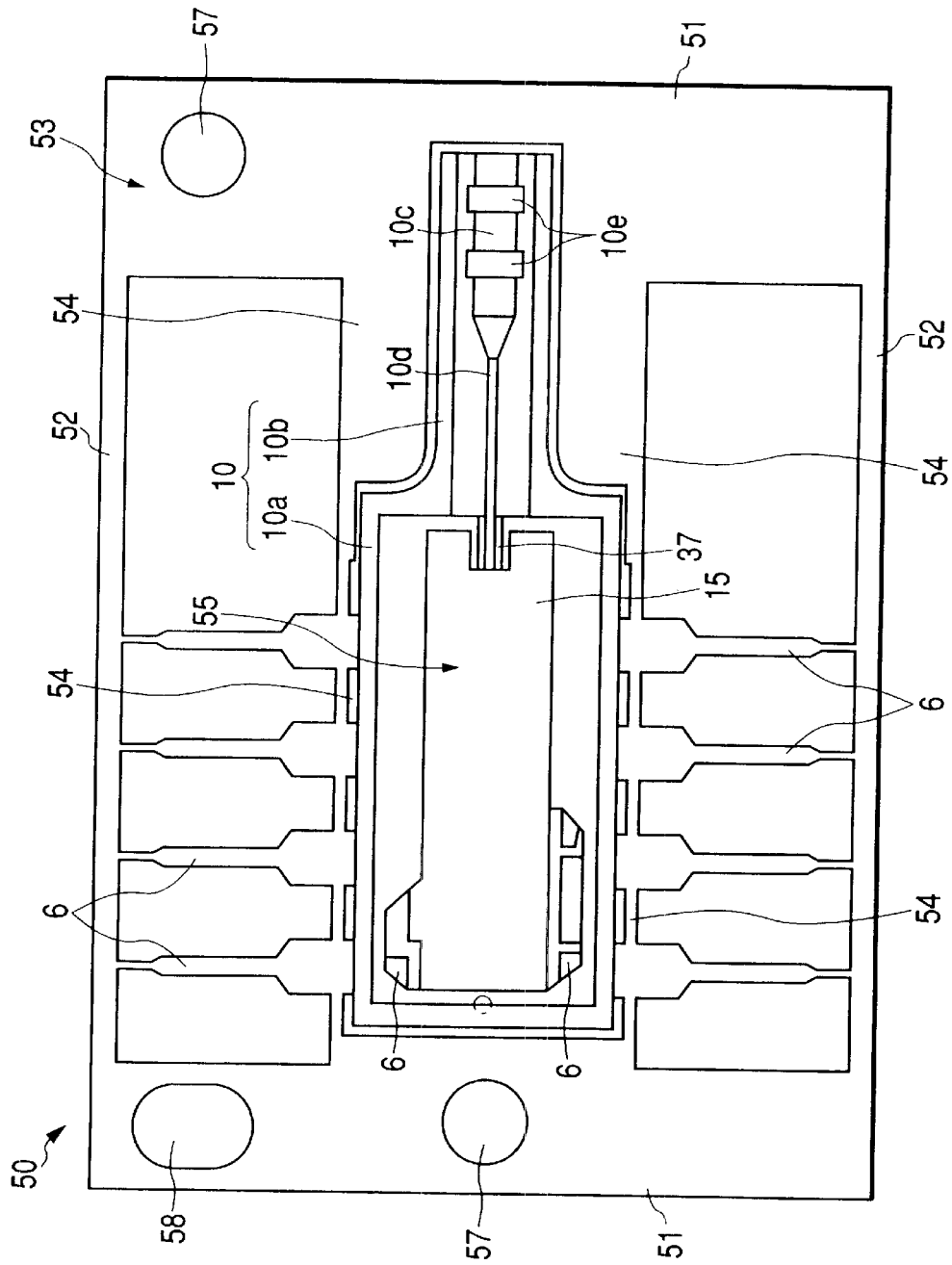
FIG. 11 is a plane view showing a case formed at a lead frame in producing the photo-electronic device according to Embodiment 1.
Figure 13:
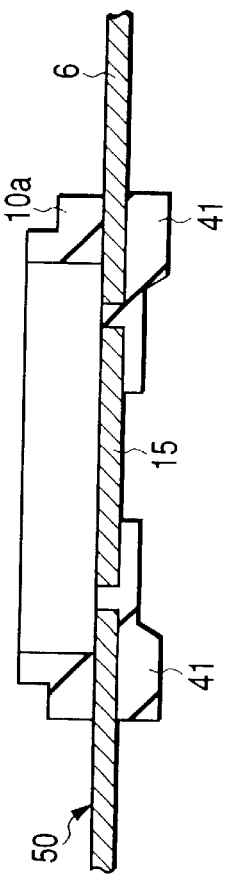
FIG. 13 is a sectional view enlarging a portion of the case formed at the lead frame.
Figure 14:
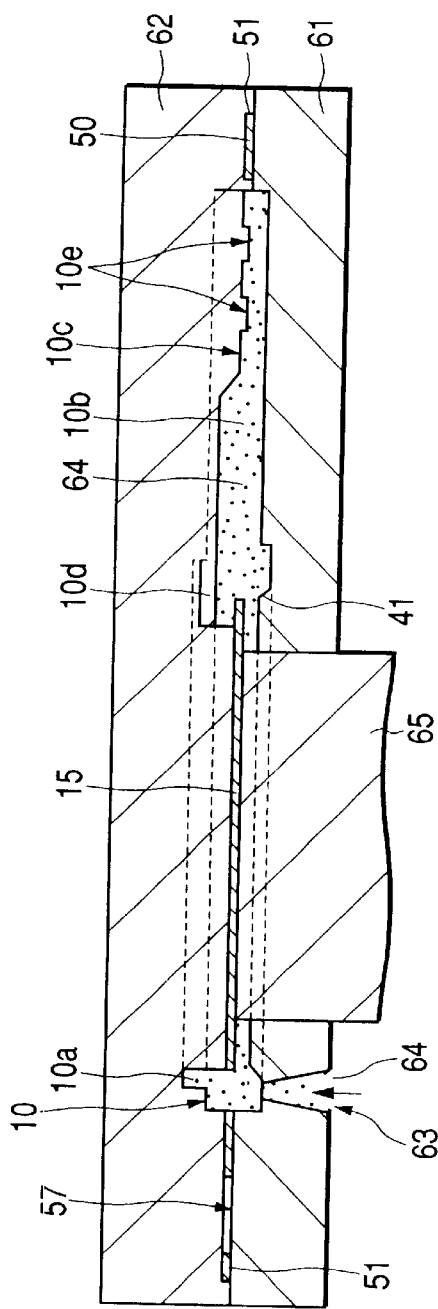
FIG. 14 is a sectional view showing a state of forming the case by a transfer mold process.

Here, an explanation will be given of the method of producing the resin case 10 having the leads. FIG. 11 is a plane view of forming the case 10 at a lead frame 50 by the transfer mold process, FIG. 12 a bottom view thereof and FIG. 13 is a sectional view thereof. Further, FIG. 14 is a sectional view showing a state of carrying out transfer mold by fastening the lead frame by a lower mold die and an upper mold die.

The lead frame 50 is formed by 42 alloy in place of copper to approximate the thermal expansion coefficient to that of silicon. Kovar may be used in place of 42 alloy. Although not particularly restricted, there is used the lead frame 50 having the thickness of 0.25 mm. As shown by FIG. 11, the lead frame 50 is provided with a frame 53 of the lead frame having a frame structure comprising a pair of outer frames 51 extended in parallel with each other and a pair of inner frames 52 extended in parallel with each other orthogonally to the outer frames 51.

Four pieces of the leads 6 are extended in parallel with the outer frames 51 at predetermined intervals from an inner side of a left half of each of the pair of inner frames 52. There is constructed a pattern in which at least one piece of the leads 6 extended from the inner frame 52 is connected to the base plate 15 at the center. The lead 6 connected to the base plate 15 constitutes package ground. There is constructed a pattern in which front ends of the remaining leads 6 face vicinities of the base plate 15. In FIG. 11, four pieces of the leads 6 are respectively projected from the inner frame 52.

The four pieces of leads 6 aligned in parallel are connected by a dam piece 54. The dam piece 54 constitutes a pattern along the outer periphery of the case 10, is made slender at a portion of the four pieces of leads 6 on the left side and expanded to the center side on the left side to thereby constitute a wide width. The case main body portion 10a is formed at the left side portion and the case guide portion 10b is formed on the right side. The case main body portion 10a is constructed by a box shape structure the upper portion of which is opened and the case guide portion 10b is provided with the slender core line guide groove 10d for guiding the optical fiber core line and the cable guide groove 10c linearly continuous to the core line guide groove 10d. The cable guide groove 10c is provided with the grooves 10e.

Figure 15:
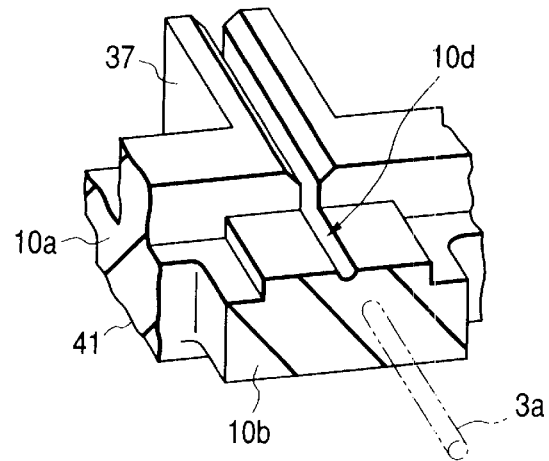
FIG. 15 is a perspective view enlarging a portion of the case.

Further, as shown by FIG. 15, the projected portion 37 is provided on an inner end side of the core line guide groove 10d and the portion constitutes a portion of forming the dam 35. Therefore, when the dam 35 is formed by potting and curing the resin over the projected portion 37 (refer to FIG. 1 and FIG. 6), an opening portion 55 for filling the protective film 36 of the case main body portion 10a and the core line guide groove 10d of the case guide portion 10b are separated by the dam 35.

A width at a portion of the lead 6 projected from the case main body portion 10a is wide and becomes slender at a middle thereof. The dam piece 54 is provided at a bold portion of the lead. Further, the frame 53 for the lead frame is provided with guide holes 57 and 58 used for transferring or positioning the lead frame 50.

In transfer mold, as shown by FIG. 14, the lead frame 50 is fastened by a mold lower die 61 and a mold upper die 62, liquid crystal polymer 64 in a liquid state is injected from a gate 63 provided at the left end portion into the cavity formed by the mold lower die 61 and the mold upper die 62 to thereby form the case 10.

In the transfer mold, the base plate 15 of the lead frame 50 is elastically pressed to the mold upper die 62 by a pressure pin 65 integrated to the mold lower die 61. Thereby, the liquid crystal polymer 64 in the liquid state is prevented from moving around to a side of a mounting face of the support plate 15 for fixing the semiconductor laser element and the like.

Figure 12:
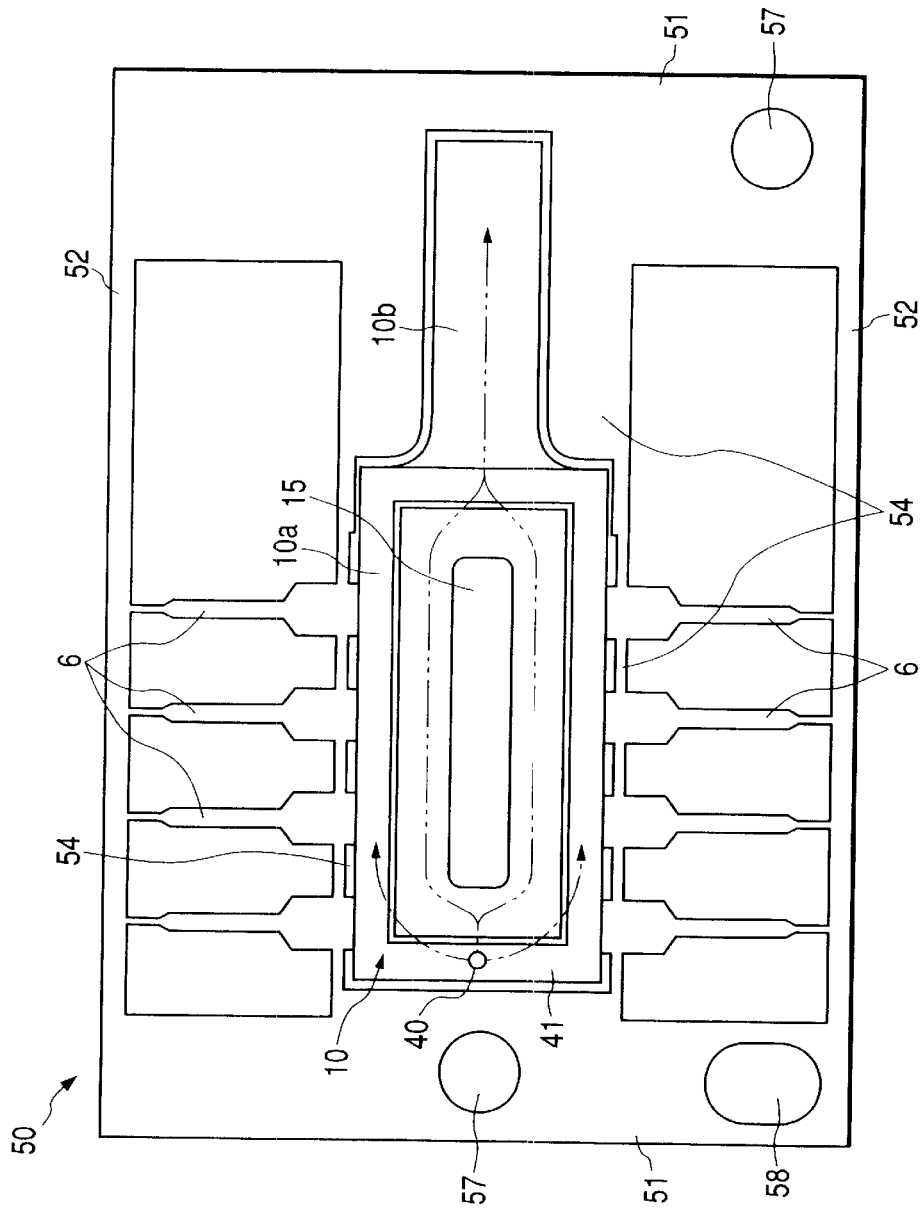
FIG. 12 is a bottom view showing the case formed at the lead frame.

FIG. 12 is the bottom view of forming the case 10 to the lead frame 50 by the transfer mold process and a round portion remaining at the bottom face of the case main body portion 10a is the gate mark 40. Further, an exposed region of the base plate 15 is a region with which the pressure pin 65 has been brought into contact. The arrow marks shown in the drawing indicate a state of flow of the liquid crystal polymer 64 in the liquid state in the cavity. As is apparent from the drawing, the direction of flow of the liquid crystal polymer 64 in the liquid state is directed along the direction of extending the optical fiber and therefore, thermal expansion coefficient of the produced case 10 in the direction of extending the optical fiber becomes as small as $2.0 \times 10^{-6}/°$C. or a numerical value proximate to that of the silicon substrate. Although an explanation will be omitted here, the cap 11 is produced also by the liquid crystal polymer and is formed such that the thermal expansion coefficient in a direction along the direction of extending the optical fiber becomes as small as $2.0 \times 10^{-6}/°$ C.

According to Embodiment 1, the slender pressure pin 65 is disposed along the center of the rear face of the base plate 15 and accordingly, there is not produced so-to-speak weld line formed by bringing portions of the resin in contact with each other at the region in contact with the pressure pin 65. As a result, there is no occurrence of crack caused by the weld line and production yield of the case with the leads is promoted.

Further, in molding the case 10 by the transfer mold, the thickness of the case 10 below the base plate 15 is thinned (for example, 0.25 mm) to thereby increase the effect of irradiating heat to the atmosphere, however, as described above, the liquid crystal polymer is provided with low tensile strength of weld and therefore, as shown by FIG. 13, the mechanical strength is increased by thickly forming the ribs 41 at the bottom peripheral edge of the case 10. Thereby, the mechanical strength of the package 5 can be increased, reliability of the package can be increased and long service life of the photo-electronic device 1 can be achieved.

Next, by cutting and removing the dam piece 54 connecting the respective leads 6 and cutting outer end portion of the leads 6 and separating the leads 6 from the inner frames 52, there can be fabricated the case of a so-to-speak butterfly type in which the leads 6 are extended straightly in the transverse direction from the case 10. Further, there can be constituted the dual in line type as shown by FIG. 4 by forming the leads 6 and bending thereof in the same direction simultaneously with cutting and separating the leads 6 or separately.

Next, an explanation will be given of assembling of the photo-electronic device by using the case 10 and the cap 11.

Figure 17:
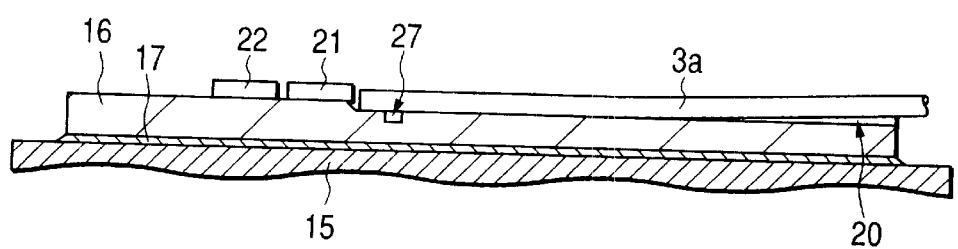
FIG. 17 is a schematic view showing a state of positioning an optical fiber core line to the silicon substrate in producing the photo-electronic device according to Embodiment 1.

As shown by FIG. 17, the silicon platform 16 fixed with the semiconductor laser element 21 and the light receiving element 22, is positioned and fixed onto the base plate 15 disposed at the inner bottom of the case 10 via the bonding member 17. Further, although not illustrated, the upper electrodes of the semiconductor laser element 21 and the light receiving element 22 and predetermined portions are connected by the wires 26.

Figure 16:
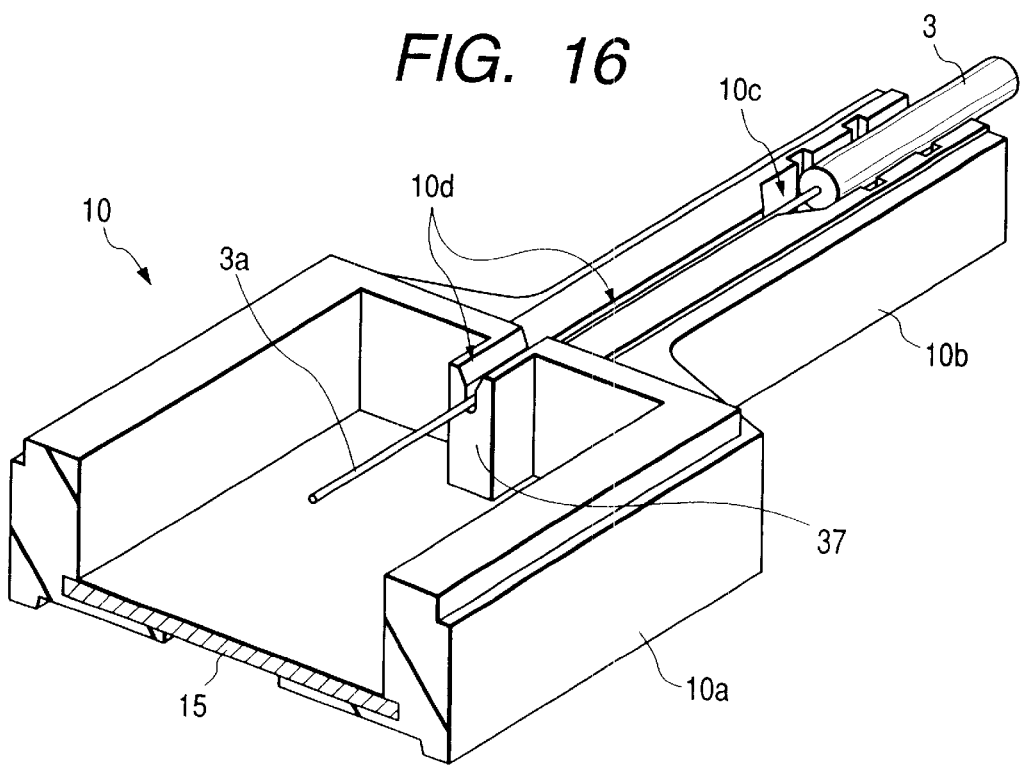
FIG. 16 is a perspective view of a portion showing a state of attaching an optical fiber to the case in producing the photo-electronic device according to Embodiment 1.

Next, as shown by FIG. 16, the optical fiber cable 3 is inserted into the cable guide groove 10c of the case guide portion 10b and the optical fiber core line 3a on the front end side is inserted into the core line guide groove 10d. Further, as shown by FIG. 17, the front end of the optical fiber core line 3a is made to face the emitting face of the semiconductor laser element 21 and is positioned and fixed to the silicon platform 16 highly accurately by a passive alignment method by using a mark, not illustrated, provided at the silicon platform 16.

Further, the positioning and fixing operation may be carried out by a method in which predetermined potential is applied between predetermined ones of the leads 6 to thereby operate the semiconductor laser element 21 to emit laser beam, the emitted beam is inputted from the front end of the optical fiber core line 3a into the optical fiber and optical couple adjustment is carried out while detecting optical output to thereby fix the front end of the optical fiber core line 3a.

Figure 18A:
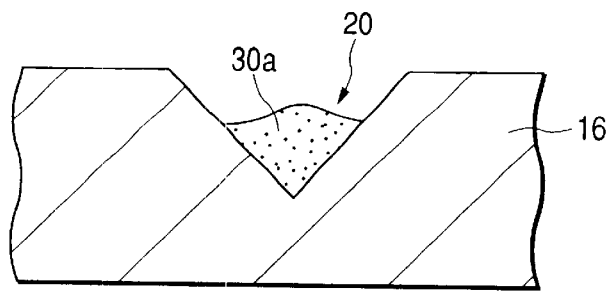
FIGS. 18A through 18C are schematic views showing a method of fixing the optical fiber core line to the silicon substrate.
Figure 18B:
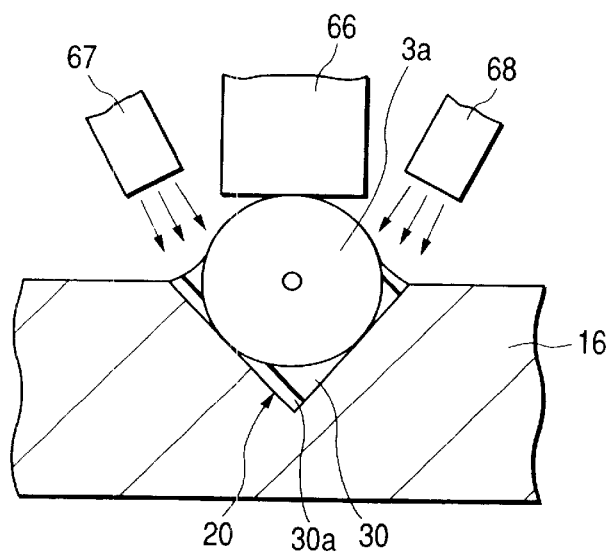
Figure 18C:
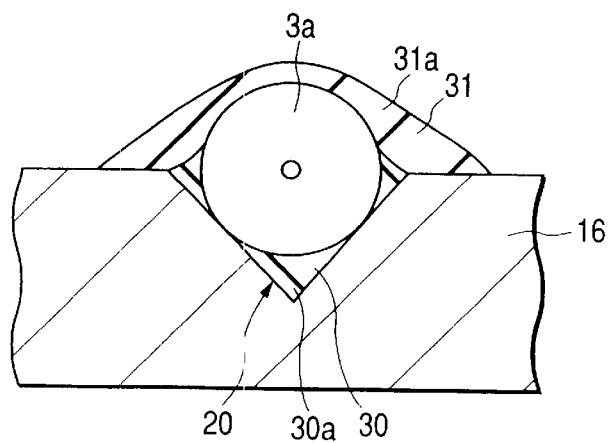

The fixing operation is carried out by a method shown by, for example, FIGS. 18A through 18C. That is, as shown by FIG. 18A, after coating an ultraviolet ray cured adhering agent 30a in the groove 20 of the silicon platform 16, the optical fiber core line 3a is pressed to the bottom of the groove 20 by pressing thereof to the ultraviolet ray cured adhering agent 30a. As shown by FIG. 18B, the pressing operation is carried out by applying predetermined load to a press piece 66. For example, a load of 100g is applied.

Next, the ultraviolet ray cured adhering agent 30a on both sides of the optical fiber core line 3a is irradiated with ultraviolet ray by using ultraviolet ray irradiating fibers 67 and 68 to thereby cure the ultraviolet ray cured adhering agent 30a. The primary fixing portion 30 is formed by the ultraviolet ray cured adhering agent 30a cured thereby and the optical fiber core line 3a is fixed to the silicon platform 16 without moving.

Next, as shown by FIG. 18C, thermosetting resin 31a is coated from above the optical fiber core line 3a to extend to the one face of the silicon platform 16 and subjected to a thermal curing processing to thereby form the secondary fixing portion 31 by the thermosetting resin 31a. Thereby, the optical fiber core line 3a is highly accurately fixed to the silicon platform 16.

Figure 19:
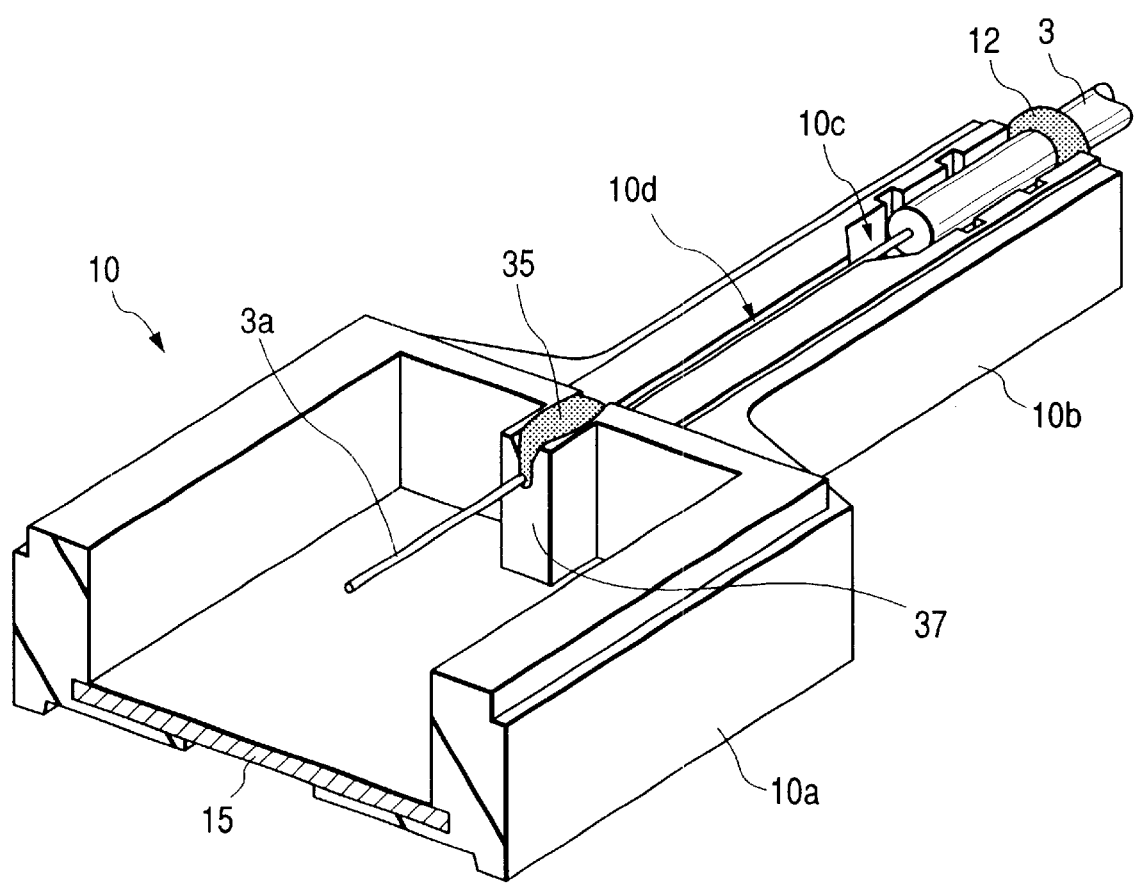
FIG. 19 is a schematic perspective view showing a state of tacking the optical fiber to a groove.

Next, as shown by FIG. 19, by fixing a portion of the optical fiber cable 3 projected from the case guide portion 10b by the ultraviolet ray cured adhering agent 12 of epoxy resin species and filling the ultraviolet ray cured adhering agent of epoxy resin species in a portion of the core line guide groove 10d at the projected portion 37 and curing thereof, the dam 35 is formed. The dam 35 is for preventing silicone resin from flowing toward the center side of the case guide portion 10b via a clearance between the core line guide groove 10d and the optical fiber core line 3a when the silicone resin is injected into the case main body portion 10a and preventing the silicone resin from being brought into contact with an adhering agent (epoxy resin of amine species) for fixing the optical fiber cable 3 and the optical fiber core line 3a at later steps.

Figure 20:
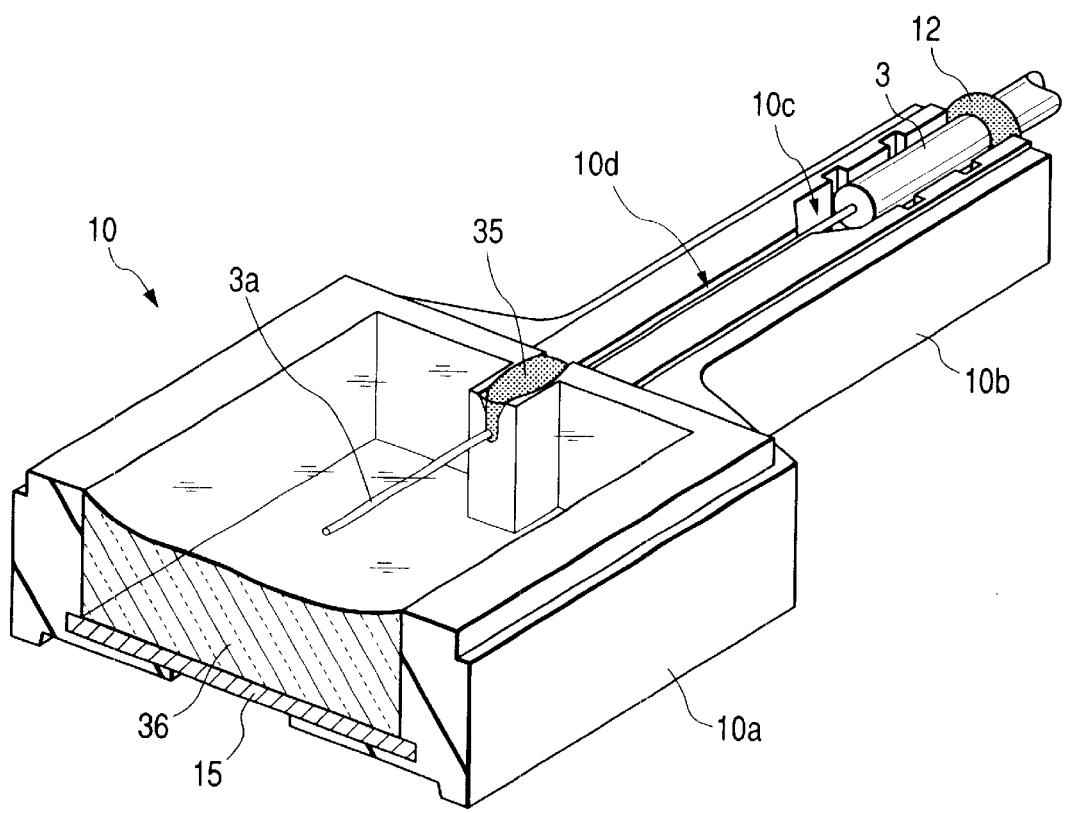
FIG. 20 is an enlarged sectional view showing a state of putting silicone gel into the case in producing the photo-electronic device according to Embodiment 1.
Figure 21:
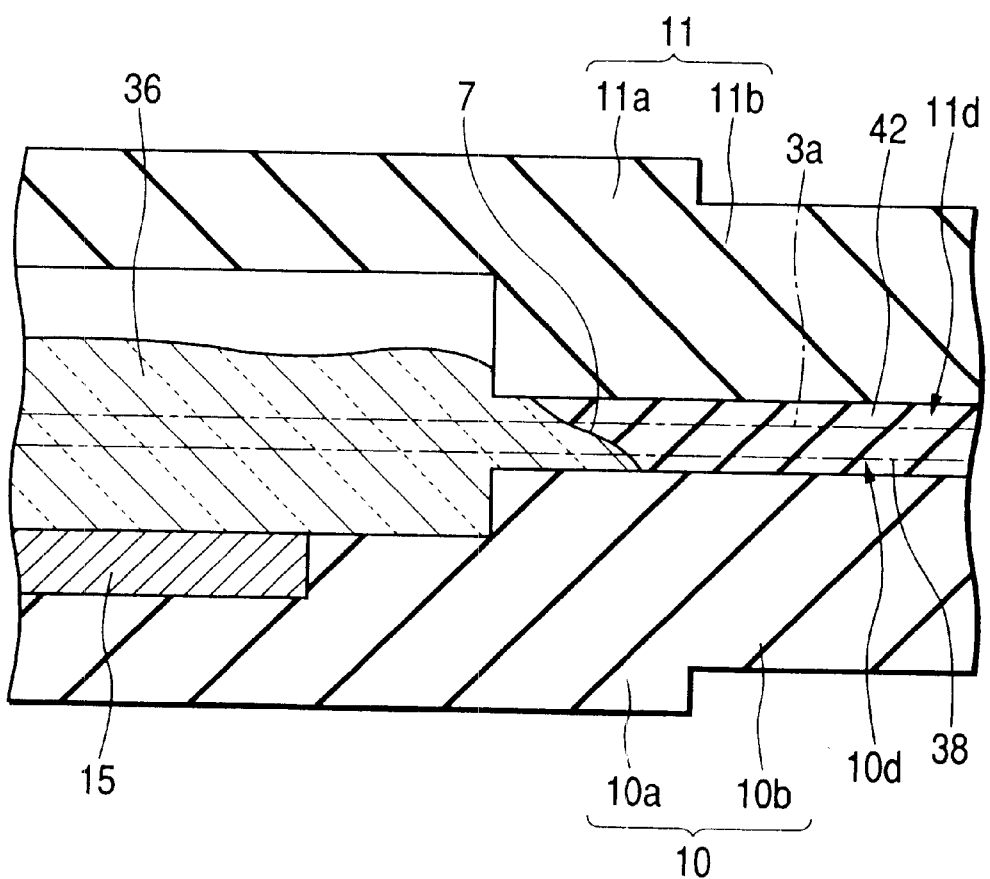
FIG. 21 is a sectional view enlarging a portion of a photo-electronic device by investigation by the applicant.

Next, as shown by FIG. 20, the silicone resin is filled in the case main body portion 10a. After filling the silicone resin, ultraviolet ray is irradiated, successively, heating and ageing (30 minutes at 120° C.) and heating and curing (1 hour at 120° C.) are carried out and the protective film 36 is formed by the gel-like resin.

Next, the core line guide groove 10d and the cable guide 10c reaching the adhering agent 12 from the dam 35, are coated and filled with epoxy resin of amine species and the resin is baked to thereby fix the optical fiber cable 3 and the optical fiber core line 3a to the case guide portion 10b by the adhering agent 38 as shown by FIG. 1.

Next, the cap 11 is made to overlap the case 10, the both members are adhered to each other by the adhering agent 42 (epoxy resin of amine species) to thereby produce the photo-electronic device (semiconductor optical module) 1 as shown by FIG. 6 and FIG. 2 through FIG. 4.

According to Embodiment 1, the following effects are achieved.

(1) Since the dam 35 is present, the protective film 36 comprising the gel-like resin provided at the main body portion and the adhering agent 38 for fixing the optical fiber (optical fiber core line 3a and optical fiber cable 3) to the guide portion are not brought into contact with each other. The resin forming the dam 35 comprises epoxy resin of ultraviolet ray cured type. Thereby, the case guide portion is filled with the epoxy resin of amine species, the adhering force adhering the case and the cap is maintained and accordingly, the fiber can be fixed firmly, thermal stress caused by thermal variation is difficult to apply to the optical fiber (optical fiber core line), the optical fiber core line is difficult to break and optical transmission failure is difficult to cause.

(2) The thermal expansion coefficient of the case 10 and the cap 11 in the direction of extending the optical fiber (optical fiber core line 3a) is $4.0 \times 10^{-4}/°$ C. (liquid crystal polymer), the thermal coefficient of the base plate 15 made of 42 alloy is $5 \times 10^{-6}/°$ C., the thermal expansion coefficient of the silicon platform 16 is $3.0 \times 10^{-6}/°$ C., the thermal expansion coefficient of the optical fiber core line 3a is $0.5 \times 10^{-6}/°$ C. and all of the thermal expansion coefficients are smaller than that of copper ($\alpha = 17 \times 10^{-6}/°$ C.) and are numerical values proximate to each other and accordingly, it is difficult to cause exfoliation caused by thermal variation of the optical fiber fixed by the silicon platform and the case guide portion. Further, the front end portion of the optical fiber is fixed to the support substrate respectively by the ultraviolet ray cured adhering agent and the thermosetting adhering agent and accordingly, adhering strength is high and exfoliation of the optical fiber is difficult to cause. As a result, at the front end of the optical fiber, a deterioration in the transmission and reception efficiency of light between the front end of the optical fiber and the semiconductor laser element is not caused and the optical fiber (optical fiber core line) at the case guide portion is difficult to break.

(3) Although liquid crystal polymer (LCP) is featured in providing high heat resistance (thermal deformation temperature equal to or higher than 260° C.) and high bending strength (bending strength: 21.1 kg/mM² at 25° C.), the tensile strength of weld after molding is small. Therefore, when the resin thickness (liquid crystal polymer thickness) below the base plate is thinned to improve heat radiating performance, the resin become brittle and is easy to break, however, increase in the strength is achieved by thickening the peripheral edge of the bottom of the case and accordingly, there is constituted the package having high reliability of mechanical strength.

(d) Since an air gap is present above the protective film, even when the protective film is expanded by heat, the expanded portion is only elongated into the air gap portion and is not brought into contact with the cap on the upper side and accordingly, the optical fiber is not applied with stress by deforming the package and the optical fiber is difficult to break.

Although a specific explanation has been given of the invention carried out by the inventors based on the embodiment as described above, the invention is not limited to the above-described embodiment and can naturally be modified variously within a range not deviated from gist thereof. That is, even in the case of a structure of connecting a light receiving element as a photoelectric conversion element and an optical fiber, the invention is similarly applicable and can achieve a similar effect.

A simple explanation will be given of effects achieved by representative aspects of the invention disclosed in the application as follows.

(1) The adhering agent comprising epoxy resin of amine species for fixing the optical fiber core line and the protective film comprising the gel-like resin are not brought into direct contact with each other, the dam comprising ultraviolet ray cured adhering agent is provided there between and accordingly, a case guide portion is filled with epoxy resin of amine species and accordingly, breakage of the optical fiber core line by thermal stress can be prevented.

(2) Although the optical fiber (optical fiber core line) is constructed by a constitution of two points support, the case is formed by liquid crystal polymer, the thermal expansion coefficient in the direction of extending the optical fiber is reduced to be proximate to the thermal expansion coefficient of the optical fiber core line, further, the base plate made of metal for fixing the silicon platform is formed by 42 alloy and therefore, the optical fiber core line is difficult to exfoliate at the support portions, the optical fiber is difficult to disconnect, the transmission and reception efficiency between the optical fiber and the semiconductor laser element is difficult to vary and the highly reliable photo-electronic device can be provided.

(3) The case is formed by liquid crystal polymer, the base plate is exposed at the bottom of the case, the thickness of resin below the base plate is thinned and accordingly, heat radiating performance of the photo-electronic device can be improved and the stably operated photo-electronic device can be provided.

(4) Although the case is formed by liquid crystal polymer having low tensile strength of weld, the thickness of the liquid crystal polymer at the peripheral edge of the bottom of the case 10 is formed to be thick as the ribs and accordingly, the mechanical strength of the case is increased and high reliability of the package is promoted.

What is claimed is:

1. A photo-electronic device comprising:

a package having a main body portion containing a photoelectric conversion element at an inner portion thereof and a guide portion for guiding, in a penetrated state, an optical fiber a front end of which faces the photoelectric conversion element for transmitting and receiving light to and from the photoelectric conversion element;

an adhering member for fixing the optical fiber to the package at the guide portion; and a protective film for covering the photoelectric conversion element and a front end portion of the optical fiber in the main body portion;

wherein a dam is provided between the protective film and the adhering agent such that the protective film and the adhering agent are not brought into contact with each other.

2. A photo-electronic device according to claim 1:

wherein the protective film is formed by a gel-like resin and the adhering agent is formed by epoxy resin.

3. The photo-electronic device according to claim 1:

wherein an air gap is present above the protective film in the main body portion.

4. The photo-electronic device according to claim 1:

wherein the package is formed by a case and a cap adhered to overlap the case, the case is formed by a case main body portion and a case guide portion continuous to the case main body portion, the cap is formed by a cap main body portion and a cap guide portion continuous to the cap main body portion, the case main body portion is embedded with a predetermined shape of a metal plate a portion of which forms a base plate exposed to an inner bottom of the main body portion, remaining portions of which form a plurality of leads extended to inside and outside of the main body portion, a support substrate is fixed onto the base plate and the photoelectric conversion element and the optical fiber for transmitting and receiving light to and from the photoelectric conversion element are fixed onto the support base plate.

5. The photo-electronic device according to claim 4:

wherein the front end portion of the optical fiber is fixed to the support substrate by an ultraviolet ray cured adhering agent and is fixed to the support substrate by a thermosetting adhering agent.

6. The photo-electronic device according to claim 4:
wherein the support substrate is a silicon substrate.

7. The photo-electronic device according to claim 4:
wherein the support substrate is fixed with a semiconductor laser element, a light receiving element and the front end portion of the optical fiber.

8. The photo-electronic device according to claim 2:
wherein the protective film is formed by any one of silicone gel, silicone rubber, low stress epoxy resin, acrylic resin and urethane resin.

9. A method of producing a photo-electronic device in which a package is formed by a case and a cap adhered to overlap the case, the case is formed by a case main body portion and a case guide portion continuous to the case main body portion, the cap is formed by a cap main body portion and a cap guide portion continuous to the cap main body portion, the case main body portion is embedded with a predetermined shape of a metal plate a portion of which forms a base plate exposed to an inner bottom of the case main body portion and remaining portions of which form a plurality of leads extended to inside and outside of the case main body portion, a support substrate is fixed onto the base plate, a photoelectric conversion element an electrode of which is connected electrically to the lead is fixed onto the support substrate, an optical fiber is supported by the guide portion in a penetrated state and fixed thereto by an adhering agent, a front end of the optical fiber is fixed to the support substrate to transmit and receive light to and from the photoelectric conversion element and a protective film which is transparent to the light covers the photoelectric conversion element and the optical fiber in the main body portion, said method comprising the steps of:

fixing the support substrate fixed with the photoelectric conversion element to inside of the main body portion;

fixing a front end portion of the optical fiber by an adhering agent;

forming the protective film by filling a resin in the main body portion; and fixing the optical fiber to the guide portion by an adhering agent;

wherein a dam is formed at a boundary portion of the main body portion and the guide portion such that the protective film does not invade the guide portion prior to forming the protective film.

10. The method of producing a photo-electronic device according to claim 9:
wherein the front end portion of the optical fiber is adhered to the support substrate by an ultraviolet ray cured adhering agent and fixed thereto by a thermosetting adhering agent.

11. The method of producing a photo-electronic device according to claim 9:
wherein the support substrate is formed by a silicon substrate.

12. The method of producing a photo-electronic device according to claim 9:
wherein a semiconductor laser element is fixed to the support substrate, the front end portion of the optical fiber is positioned and fixed such that laser beam on one side emitted from the semiconductor laser element is inputted from a front end thereof to an inner portion thereof and a light receiving element is positioned and fixed to receive the laser beam on other side emitted from the semiconductor laser element.

13. The method of producing a photo-electronic device according to claim 9:
wherein the protective film is formed by a gel-like resin, the adhering agent for fixing the optical fiber to the case guide portion is formed by epoxy resin and the dam is formed by an ultraviolet ray cured adhering agent.

14. The method of producing a photo-electronic device according to claim 13:
wherein the protective film is formed by any one of silicone gel, silicone rubber, low stress epoxy resin, acrylic resin and urethane resin any of which is transparent to the light.

15. A photo-electronic device comprising:
(a) a photoelectric conversion element;
(b) an optical fiber for transmitting and receiving light to and from the photoelectric conversion element;
(c) a case having a main body portion having a recess for containing the photoelectric conversion element and a guide portion for supporting the optical fiber and formed by a resin;
(d) a cap having portions in correspondence with the main body portion and the guide portion and comprising a resin;
(e) a protective film for covering the photoelectric conversion element contained in the recess of the case and the optical fiber extended from the guide portion to a vicinity of the photoelectric conversion element;
(f) an adhering layer for adhering the optical fiber to the case at the guide portion; and
(g) a dam for preventing the protective film from being brought into direct contact with the adhering layer.

16. A method of producing a photo-electronic device which is a photo-electronic device comprising a photoelectric conversion element, an optical fiber for transmitting and receiving light to and from the photoelectric conversion element, a case having a main body portion having a recess for containing the photoelectric conversion element and a guide portion for supporting the optical fiber and formed by a resin and a cap having portions in correspondence with the main body portion and the guide portion and comprising a resin, said method comprising the steps of:
(a) mounting the photoelectric conversion element to the recess of the case;
(b) fixing a front end of the optical fiber to a vicinity of the photoelectric conversion element;
(c) covering the photoelectric conversion element contained in the recess of the case and the optical fiber extended from the guide portion to the vicinity of the photoelectric conversion element by a first resin film; and
(d) adhering the optical fiber to the case by a second resin film in the guide portion, further comprising the step of:
forming a third resin film for covering the optical fiber at a boundary portion of the main body portion and the guide portion to prevent the first resin film from leaking to the guide portion prior to the step (c).

* * * * *